United States Patent
Ichige et al.

(10) Patent No.: US 7,045,423 B2
(45) Date of Patent: May 16, 2006

(54) NON-VOLATILE SEMICONDUCTOR MEMORY DEVICE WITH MULTI-LAYER GATE STRUCTURE

(75) Inventors: Masayuki Ichige, Yokohama (JP); Yuji Takeuchi, Yokohama (JP); Michiharu Matsui, Fujisawa (JP); Atsuhiro Sato, Zushi (JP); Kikuko Sugimae, Yokohama (JP); Riichiro Shirota, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/020,314

(22) Filed: Dec. 27, 2004

(65) Prior Publication Data

US 2005/0104120 A1    May 19, 2005

Related U.S. Application Data

(62) Division of application No. 10/155,086, filed on May 28, 2002, now Pat. No. 6,853,029.

(30) Foreign Application Priority Data

| May 28, 2001 | (JP) | 2001-158066 |
| Jul. 2, 2001 | (JP) | 2001-201366 |
| May 17, 2002 | (JP) | 2002-143481 |
| May 24, 2002 | (JP) | 2002-150853 |

(51) Int. Cl.
   *H01L 21/8247* (2006.01)
(52) U.S. Cl. .................................................. 438/258
(58) Field of Classification Search ......... 438/257–267
   See application file for complete search history.

(56) References Cited

U.S. PATENT DOCUMENTS

| 4,420,871 A | * | 12/1983 | Scheibe ....................... 438/258 |
| 4,766,088 A | | 8/1988 | Kono et al. |
| 5,472,892 A | | 12/1995 | Gwen et al. |
| 5,904,530 A | | 5/1999 | Shin |
| 6,406,959 B1 | | 6/2002 | Prall et al. |

FOREIGN PATENT DOCUMENTS

| JP | 59-74677 | 4/1984 |
| JP | 2002-9173 | 1/2002 |

* cited by examiner

*Primary Examiner*—Richard A. Booth
(74) *Attorney, Agent, or Firm*—Oblon, Spivak, McClelland, Maier & Neustadt, P.C.

(57) ABSTRACT

A semiconductor device includes a semiconductor substrate, source and drain regions, a channel region, a gate insulating film, a charge storage layer, and a control gate electrode. The source and drain regions include first impurities of a first conductivity type. The channel region includes second impurities of a second conductivity type. The gate insulating film includes the second impurities in a region thereof located immediately above at least a portion of the channel region. The charge storage layer is formed on the gate insulating film. The control gate electrode is provided on the charge storage layer. The control gate electrode is formed on the charge storage layer and is electrically connected to the charge storage layer by a connection portion provided on a part of the charge storage layer, which is located immediately above at least a part of the region of the gate insulating film including the second impurities.

4 Claims, 24 Drawing Sheets

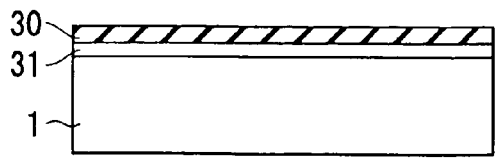
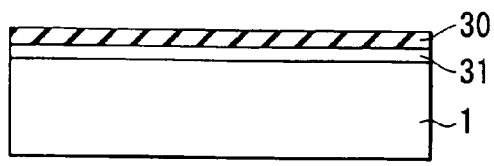
FIG. 4A  FIG. 4B
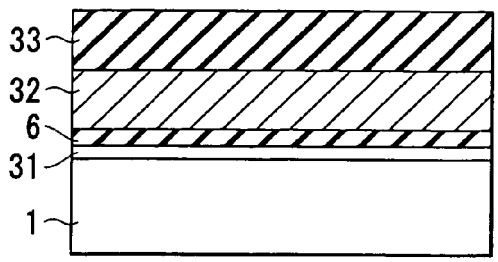
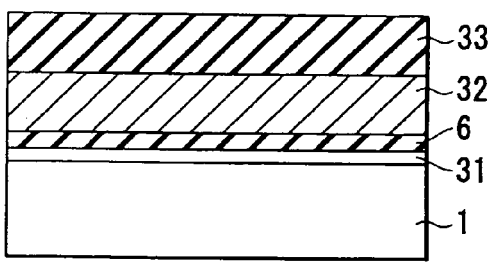
FIG. 5A  FIG. 5B
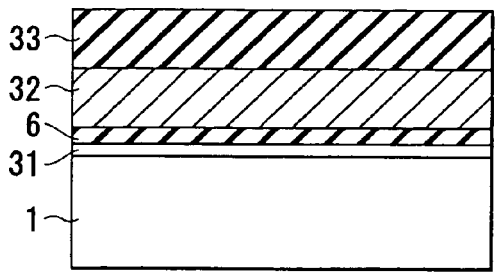
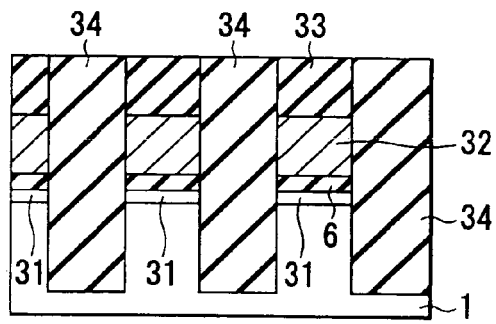
FIG. 6A  FIG. 6B
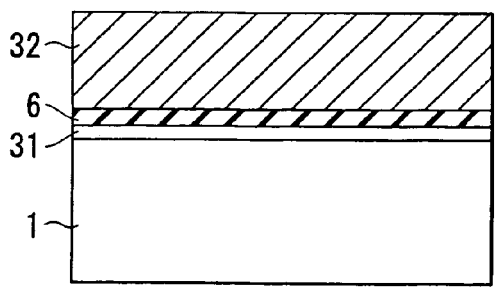
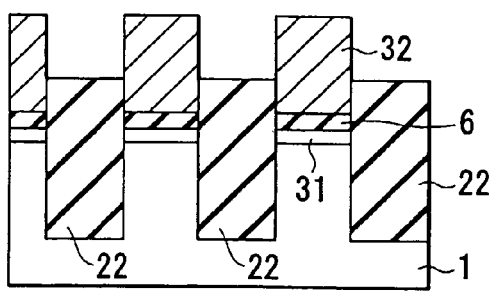
FIG. 7A  FIG. 7B

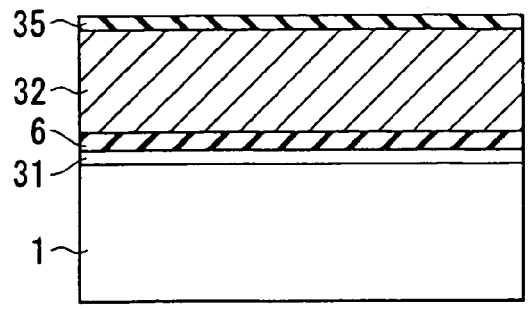
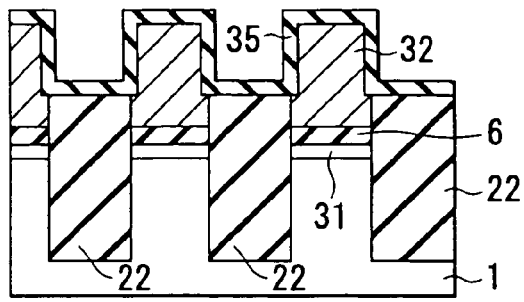
FIG. 8A  FIG. 8B
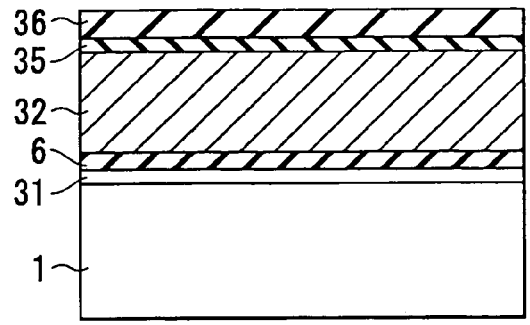
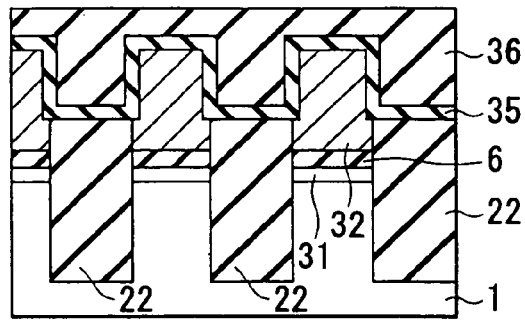
FIG. 9A  FIG. 9B
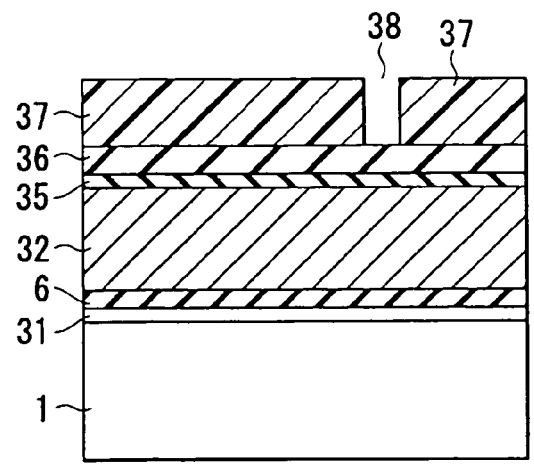
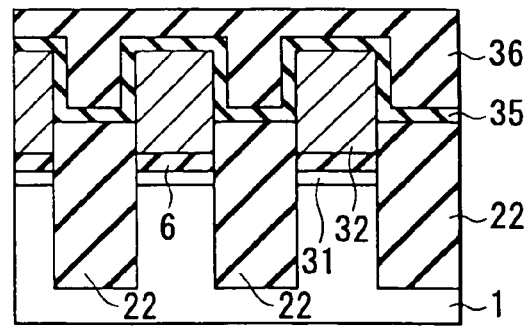
FIG. 10A  FIG. 10B

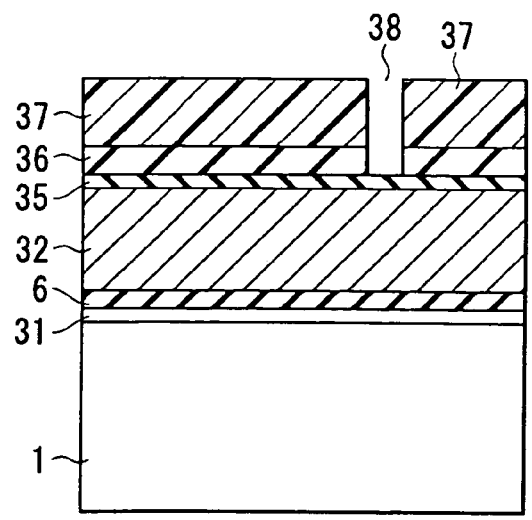 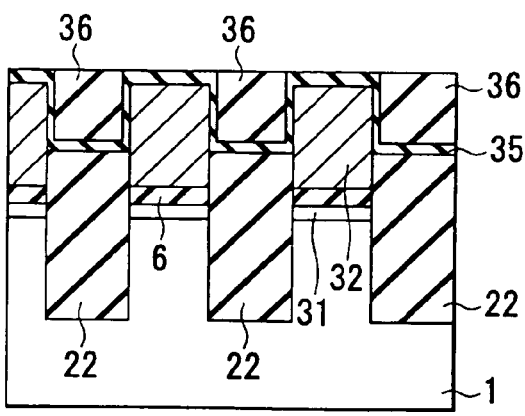
FIG. 11A  FIG. 11B
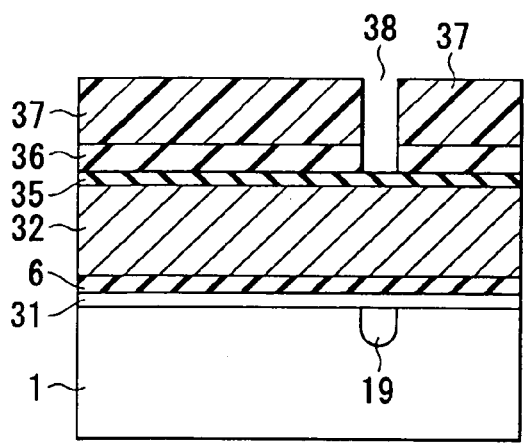 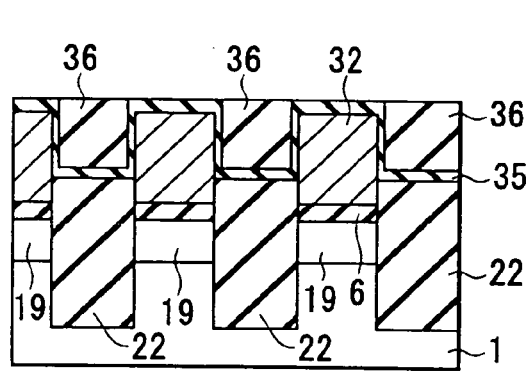
FIG. 12A  FIG. 12B
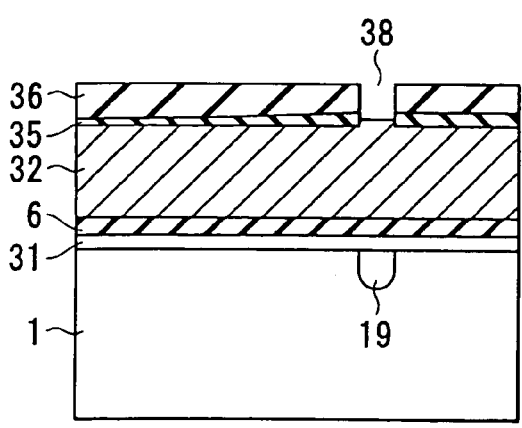 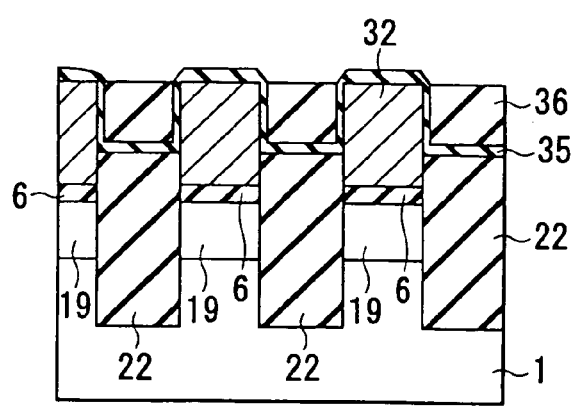
FIG. 13A  FIG. 13B

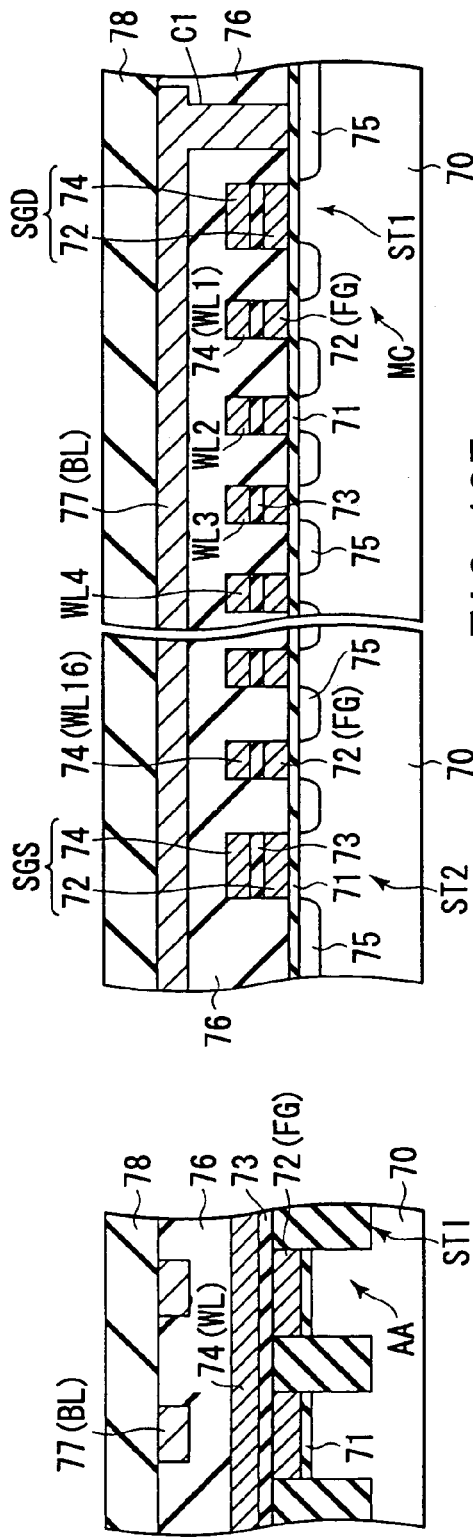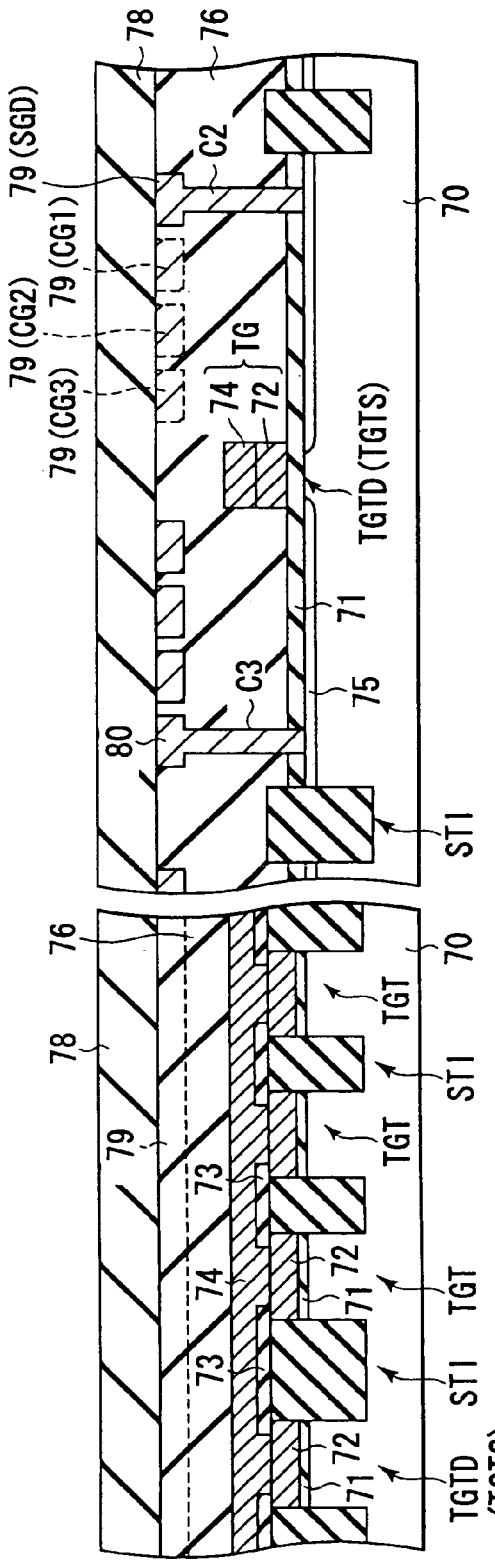

|  |  | SGD | SGS | CG (SELECTED MEMORY CELL) | CG (NEXT-SELECTED MEMORY CELL) | CG (UNSELECTED MEMORY CELL) |
|---|---|---|---|---|---|---|
| WRITE | SB | Vcc (3V) | 0V | Vpp (20V) | Vpass (7V) | Vpass (7V) |
| | LSB | Vcc (3V) | 0V | Vpp (20V) | 0V, 0V | Vpass (7V) |
| | ESB | Vcc (3V) | 0V | Vpp (20V) | 0V | Vpass (7V) |
| READ | | Vcc (3V) | Vcc (3V) | 0V | Vread (5V) | Vread (5V) |
| ERASE | | FLOATING →Vpp (20V) | FLOATING →Vpp (20V) | 0V※1 | | FLOATING→ (Vpp20V) ※2 |

※1: SELECTED BLOCK
※2: UNSELECTED BLOCK

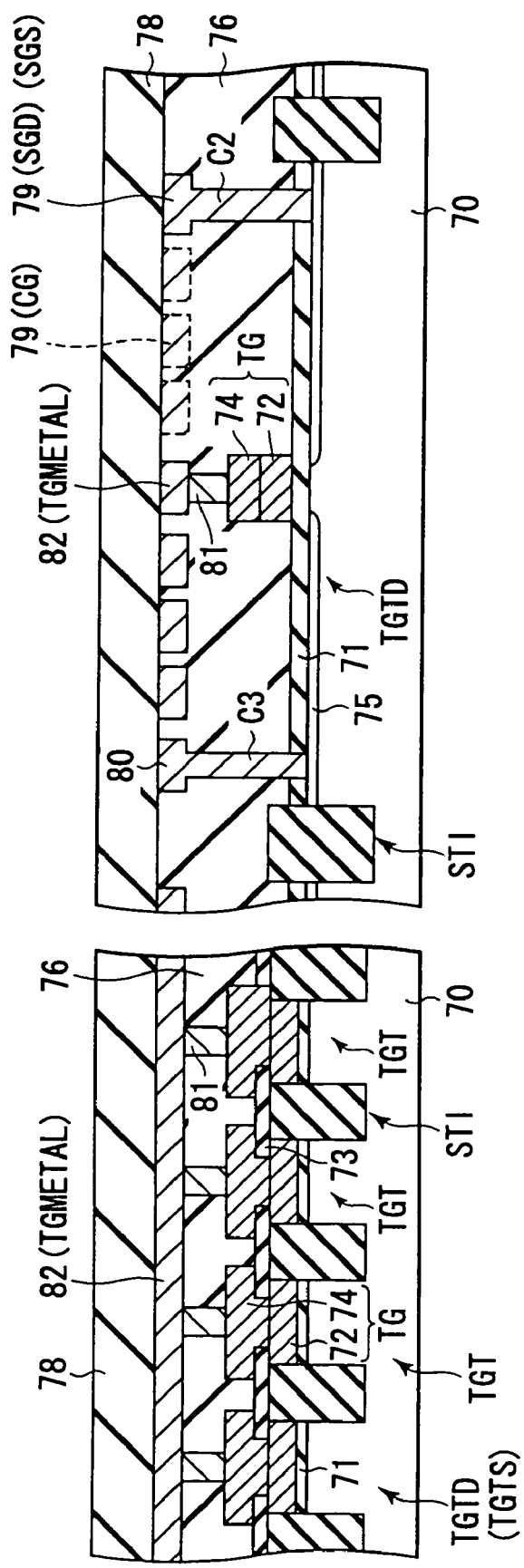

NON-VOLATILE SEMICONDUCTOR MEMORY DEVICE WITH MULTI-LAYER GATE STRUCTURE

CROSS-REFERENCE TO RELATED APPLICATIONS

This application is based upon and claims the benefit of priority from the prior Japanese Patent Applications No. 2001-158066, filed May 28, 2001; No. 2001-201366, filed Jul. 2, 2001; No. 2002-143481, filed May 17, 2002; and No. 2002-150853, filed May 24, 2002, the entire contents of all of which are incorporated herein by reference.

BACKGROUND OF THE INVENTION

1. Field of the Invention

The present invention relates to a semiconductor device and a method of manufacturing the same. In particular, the invention relates to a very fine semiconductor device with a transistor having a channel region in which impurities are implanted. In addition, the invention relates to a structure of a row core circuit in a NAND type flash memory.

2. Description of the Related Art

Recently, EEPROMs (Electrically Erasable Programmable Read Only Memory) have been known as non-volatile semiconductor memories capable of electrically writing and erasing data. EEPROMs include a flash memory capable of effecting electrical batch-erase. In particular, NAND type flash memories, which permit easy realization of higher integration, are widely used.

Manufacturing methods of conventional NAND type flash memories are proposed, for instance, in S. Aritome, et al., IEDM (1994) pp. 61–64, "A 0.67 $\mu m^2$ SELF-ALIGNED SHALLOW TRENCH ISOLATION CELL (SA-STI CELL) FOR 3V-only 256 Mbit NAND EEPROMs"; or Y. Takeuchi, et al., 1998 Symposium on VLSI Technology Digest of Technical Papers, pp. 102–103, "A Self-Aligned STI Process Integration for Low Cost and Highly Reliable 1 Gbit Flash Memories." According to these proposals, an element isolation region between memory cells is formed by STI (Shallow Trench Isolation) technology. A floating gate is formed so as to have a self-aligned structure (SA-STI) relative to the element isolation region. Thereby, a memory cell array comprising fine memory cells arranged with high density is realized. In the manufacturing process, the element isolation region is formed after a gate oxide film and a part or all of a floating gate electrode material have been formed. In addition, impurities are introduced by ion implantation into channel regions of transistors used for memory cells and a peripheral control system, before the gate oxide film is formed. Thereafter, the gate insulating film is formed. Thermal diffusion of the introduced impurities is effected by heat treatment in a subsequent step of forming the element isolation region. The impurities are activated by the thermal diffusion.

In the NAND type flash memory, when data "1" is written in the memory cell (i.e. a threshold voltage for data erase state is kept without introducing electrons in the floating gate), the bit line is charged with initial potential. In addition, a write voltage is applied to the selected word line, and a transfer voltage is applied to the unselected word line. The potential of the channel region of the memory cell transistor is raised by capacitive coupling, thereby preventing injection of electrons in the floating gate. If the impurity concentration of the channel region is lowered, the channel capacitance decreases and the channel region potential tends to rise easily. As a result, the characteristics of write of data "1" in the memory cell are enhanced.

Several methods of fabricating flash memories have been proposed, considering the above write operation and paying attention to the control of impurity concentrations in channel regions of memory cell transistors. For example, Jpn. Pat. Appln. KOKAI Publication No. 2002-009173 discloses a method wherein a gate oxide film and an element isolation region are successively formed, following which ion implantation is effected through the gate oxide film and a floating gate. According to this method, the impurity concentration profile in the channel region is not affected by heat treatment in an element isolation region forming step. Accordingly, a steep profile of impurity concentration can be realized. Thus, even if the channel length is decreased, the impurity concentration in the channel region can be sufficiently controlled.

U.S. patent application Ser. No. 10/058,343 (corresponding to Japanese Patent Application No. 2001-23973) presents a proposal relating mainly to a NAND type flash memory. Specifically, it discloses a method wherein after a mask is formed on a memory cell transistor, impurities are obliquely ion-implanted in an impurity diffusion layer between adjacent select transistors. According to this method, the impurity concentration in the channel region of the memory cell transistor is made equal to that in the channel region of the select transistor, and the characteristics of the select transistor can easily be controlled.

U.S. patent application Ser. No. 09/956,986 (corresponding to Japanese Patent Application No. 2000-291910) also presents a proposal relating to a NAND type flash memory. Specifically, it discloses a method of removing an inter-gate insulating film that isolates a floating gate and a control gate in gate electrodes of a peripheral control system transistor and a select transistor. Thereby, the floating gate and control gate can be electrically connected.

Jpn. Pat. Appln. KOKAI Publication No. 59-74677 discloses, as shown in FIGS. 4–11, that an opening portion is made in an insulating film between a floating gate and a control gate in a peripheral transistor. This increases the degree of freedom in designing wiring.

As has been described above, various proposals have been presented with respect to methods of manufacturing flash memories. However, in the case of the method of forming an element isolation region after the formation of a channel region, impurities in the channel region tend to easily diffuse, and miniaturization of the channel length of the transistor becomes difficult. The reason is that many thermal steps exist after the formation of the channel region. This problem is conspicuous, in particular, when the gate length of the memory cell transistor is less than about 0.2 μm.

On the other hand, as the degree of miniaturization progresses, it becomes difficult to carry out the method wherein the ion implantation in the channel region of the memory cell transistor and the ion implantation in the channel region of the select transistor are performed in different steps. Moreover, since the number of lithographic steps increases, the total number of fabrication steps increases. This method is hardly feasible, for example, when a very fine, high-density memory cell unit is to be formed, which would have a channel length of about 0.3 μm or less of the select transistor and a channel length of about 0.15 μm or less of the memory cell transistor.

However, if the impurity region in the channel region of the memory cell transistor and the impurity region in the channel region of the select transistor are to be formed at the same time, it is difficult to increase the impurity concentration in the channel region of the select transistor. As a result, the cut-off characteristics of the select transistor may deteriorate. In other words, there is no choice but to set the impurity concentration in the channel region of the select transistor at a concentration value that satisfies memory cell characteristics necessary for the memory cell transistor. This concentration value is usually lower than the concentration necessary for the select transistor. In short, there is no choice but to set the impurity concentration in the channel region of the select transistor at a concentration value lower than an ideal value. Consequently, the select transistor may not normally operate because the threshold voltage decreases and an off-leak current increases. The memory cell characteristics in this context refer to data retention characteristics, write/erase characteristics and the degree of degradation in characteristics due to write/erase.

In the NAND type flash EEPROM, like other semiconductor devices such as DRAMs (Dynamic Random Access Memories) or SRAMs (Static RAMs), one word line is selected by a row decoder, and data write/read is effected for a selected memory cell (page). The row decoder comprises a row main decoder circuit and a row core circuit (row sub-decoder circuit). In accordance with row address signals, the row main decoder circuit generates predetermined voltages to be applied to control gate lines and select gate lines in the memory cell array. The row core circuit functions as a switch between the row main decoder circuit and the memory cell array.

The structure of the row core circuit will now be described with reference to FIGS. 1A and 1B. FIG. 1A is a plan view of the row core circuit, and FIG. 1B is a cross-sectional view taken along line 1B—1B in FIG. 1A.

As is shown in the Figures, a plurality of active areas AA (Active Area) are provided in matrix on a silicon substrate 200. Element isolation regions STI are provided between adjacent active areas AA. Transfer gate transistors TGTD, TGTS, TGT, TGT, . . . , are formed on the electrically isolated active regions AA. Each of the transfer gate transistors TGTD, TGTS, TGT, TGT, . . . , has a gate electrode TG and impurity diffusion layers (not shown). The gate electrode TG is provided on a gate insulating film 210 on the active area AA. The gate electrode TG comprises a polysilicon film 220 and a polysilicon film 240 provided over the polysilicon film 220 via an inter-gate insulating film 230. The polysilicon films 220 and 240 are electrically connected on the active area AA. Interlayer insulating films 260 and 280 are provided so as to cover the transfer gate transistors TGTD, TGTS and TGT.

Gate electrodes TG of transfer gate transistors TGTD, TGTS and TGT provided in the active areas AA of the same row are commonly connected. Impurity diffusion layers (drain regions) on one side of the transfer gate transistors TGTD, TGTS and TGT are connected to a drain-side select gate line SGD, a source-side select gate line SGS and control gate lines CG, respectively. More specifically, the select gate lines SGD and SGS and control gate lines CG are led into the row core circuit by shunt wiring 290 provided in the interlayer insulating film 260, and connected to the impurity diffusion layers of the associated transfer gate transistors TGTD, TGTS and TGT via contact holes C20. Impurity diffusion layers (source regions) on the other side of the transfer gate transistors TGTD, TGTS and TGT are supplied with predetermined voltages from the row main decoder via metal wiring layers 300.

FIG. 1C is an enlarged view of FIG. 1B. As is shown in FIG. 1C, a parasitic MOS transistor exists in a region between adjacent active areas AA arranged along the control gate line. The parasitic MOS transistor is formed, with the polysilicon film 240 serving as a gate electrode thereof, and the gate insulating film 230 and element isolation region STI as a gate insulating film thereof. A high voltage Vpgm is applied to the gate electrodes TG to turn on the transfer gate transistors TGTD, TGTS and TGT. At this time, the parasitic MOS transistor may be turned on. In such a case, an inversion region CH forms in the vicinity of the element isolation region STI. Consequently, adjacent active areas AA arranged with the element isolation region STI interposed may be rendered conductive.

The transfer gate transistors TGT are designed such that a turned-on transfer gate transistor TGT and a turned-off transfer gate transistor TGT may not be arranged adjacent to each other in the same row. In other words, the control gate lines connected to the transfer gate transistors TGT provided in the same row are designed such that adjacent control gate lines are not set in the selected state and unselected state. The reason is as follows. At the time of data write, in particular, a high voltage Vpgm is applied to the active area AA (impurity diffusion layer) of the selected transfer gate transistor TGT. On the other hand, 0V is applied to the active area AA of the unselected transfer gate transistor TGT. If the potential difference increases between the adjacent active areas AA, insulation therebetween cannot be maintained.

However, in the case where the transfer gate transistors TGTD and TGTS connected to the select gate lines SGD and SGS and the transfer gate transistors TGT connected to the control gate lines CG are provided in the same row, it is difficult to avoid such a situation from occurring, that both transistors have the relationship of selection and non-selection.

This situation will be described with reference to FIG. 1C. As shown in FIG. 1C, the transfer gate transistor TGT connected to the selected control gate line CG and the transfer gate transistor TGTD connected to the unselected select gate line SGD are arranged adjacent to each other in the same row. In this case, both active areas AA have a high potential Vpgm and a ground potential GND, with the element isolation region STI interposed. In addition, the polysilicon film 240, which becomes part of the gate electrode TG, is present on the element isolation region STI. The polysilicon film 240 is supplied with the high voltage Vpgm to turn on the transfer gate transistors TGTD and TGT. In this case, a potential difference between both active areas AA exceeds the withstand voltage of the element isolation region STI. As a result, the element isolation region STI may not maintain electrical insulation between the active areas AA.

The problem with the element isolation may be solved by increasing the width d10 (see FIG. 1A) of the element isolation region STI in the direction of the control gate line CG. However, there are locations at random, where the transfer gate transistors TGT and the transfer gate transistors TGTD and TGTS are arranged adjacent to each other in the direction of control gate lines. In order to solve the problem, it is thus necessary to increase the width d10 of element isolation regions over the entire area of the row core circuit. If this is done, the area of the row core circuit increases and the NAND type flash EEPROM cannot be reduced in size.

BRIEF SUMMARY OF THE INVENTION

A semiconductor device according to an aspect of the present invention comprises:
a semiconductor substrate;
source and drain regions formed in the semiconductor substrate and including first impurities of a first conductivity type;
a channel region formed in the semiconductor substrate between the source and drain regions and including second impurities of a second conductivity type;

a gate insulating film formed on the semiconductor substrate and including the second impurities in a region thereof located immediately above at least a portion of the channel region;

a charge storage layer formed on a part of the gate insulating film, which is located above the channel region; and a control gate electrode provided on the charge storage layer, and electrically connected to the charge storage layer by a connection portion provided on a part of the charge storage layer, which is located immediately above at least a part of the region of the gate insulating film including the second impurities.

A semiconductor device according to another aspect of the present invention comprises:

a first active area group including a plurality of active areas that are electrically isolated by element isolation regions and provided in a first direction;

a second active area group including a plurality of the first active area groups, which are electrically isolated by element isolation regions and provided in a second direction perpendicular to the first direction; and a MOS transistor provided in each of the active areas, the MOS transistor having a gate electrode commonly connected among the plurality of first active area group, a first impurity diffusion layer connected to one of a control gate for a memory cell and a select gate of a select transistor, and a second impurity diffusion layer supplied with a voltage from a row decoder, the MOS transistor connected to the select gate being provided only in the active area located at an end portion of the second active area group, and a width of the element isolation region between the first active area group including the MOS transistor connected to the select gate and the adjacent first active area group being greater than a width of the element isolation region between the first active area groups including only the MOS transistors connected to the control gates.

A method for fabricating a semiconductor device according to another aspect of the invention comprises:

implanting impurities of a first conductivity in a surface of a semiconductor substrate at a first concentration;

forming a gate insulating film on the surface of the semiconductor substrate;

forming a charge storage layer on the gate insulating film;

forming a element isolation region in the semiconductor substrate and the gate insulating film;

forming an inter-gate insulating film on the element isolation region and the charge storage layer;

forming on the inter-gate insulating film a mask material having an opening portion which exposes at least a part of a surface of the inter-gate insulating film;

implanting impurities of the first conductivity type in the semiconductor substrate via the opening portion in the mask material at a second concentration higher than the first concentration;

removing the inter-gate insulating film that is exposed to the opening portion in the mask material;

forming a control gate electrode on the inter-gate insulating film, the control gate electrode being connected to the charge storage layer via a region where the inter-gate insulating film has been removed;

forming a stacked gate electrode by patterning the charge storage layer, the inter-gate insulating film and the control gate electrode; and forming source and drain regions by implanting impurities of a second conductivity type in the semiconductor substrate around the gate electrode.

BRIEF DESCRIPTION OF THE SEVERAL VIEWS OF THE DRAWING

FIGS. 4A and 4B through FIGS. 15A and 15B are cross-sectional views successively showing manufacturing steps of the NAND type flash memory according to the first embodiment of the invention;

FIG. 19D is a cross-sectional view taken along line 19D—19D in FIG. 19C;

FIG. 19E is a cross-sectional view taken along line 19E—19E in FIG. 19C;

FIG. 19F is a cross-sectional view taken along line 19F—19F in FIG. 19C;

FIG. 19G is a cross-sectional view taken along line 19G—19G in FIG. 19C;

FIG. 22B is a cross-sectional view taken along line 22B—22B in FIG. 22A;

FIG. 22C is a cross-sectional view taken along line 22C—22C in FIG. 22A;

DETAILED DESCRIPTION OF THE INVENTION

Figure 2A:
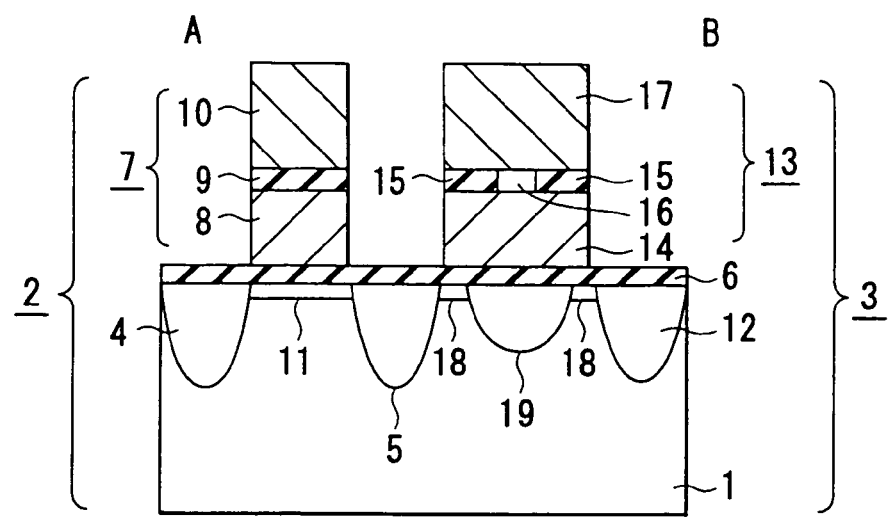
FIG. 2A is a cross-sectional view of a flash memory according to a first embodiment of the present invention.

A semiconductor device according to a first embodiment of the present invention will now be described with reference to FIG. 2A. FIG. 2A is a cross-sectional view of the semiconductor device.

As is shown in FIG. 2A, a memory cell transistor 2 and a select transistor 3 are provided on a semiconductor substrate 1. The memory cell transistor 2 has source/drain regions 4 and 5 provided in the semiconductor substrate 1. The memory cell transistor 2 has a gate electrode 7 provided on the semiconductor substrate 1 between the source/drain regions 4 and 5 with a gate insulating film 6 interposed therebetween. The gate electrode 7 comprises a charge storage layer (floating gate) 8 formed directly on the gate insulating film 6, an inter-gate insulating film 9 formed on the charge storage layer 8, and a control gate 10 formed on the inter-gate insulating film 9. A channel diffusion layer 11 is formed near the surface of the semiconductor substrate 1 between the source/drain regions 4 and 5.

The select transistor 3 is provided adjacent to the memory cell transistor 2. The select transistor 3 has source/drain regions 5 and 12 provided in the semiconductor substrate 1. Of the source/drain regions 5 and 12, the source/drain region 5 closer to the memory cell transistor 2 is commonly connected to the source/drain region 5 of the memory cell transistor 2. The select transistor 3 has a gate electrode 13 provided on the semiconductor substrate 1 between the source/drain regions 5 and 12 with the gate insulating film 6 interposed therebetween. The gate electrode 13 comprises a charge storage layer (floating gate) 14 formed directly on the gate insulating film 6, an inter-gate insulating film 15 formed on the charge storage layer 14, and a control gate electrode 17 formed on the inter-gate insulating film 15. An opening portion 16 is formed in the inter-gate insulating film 15. The opening portion 16 is filled with the same electrically conductive material as the control gate electrode 17. The opening portion 16 serves as a connection portion for electrical connection between the control gate electrode 17 and charge storage layer 14. A channel diffusion layer 18 is formed near the surface of the semiconductor substrate 1 between the source/drain regions 5 and 12 such that the channel diffusion layer 18 contacts the source/drain regions 5 and 12. In addition, a channel diffusion layer 19 is formed near the surface of the semiconductor substrate 1 immediately below the opening portion 16, and the channel diffusion layer 19 is surrounded by the channel diffusion layer 18. The channel diffusion layer 18 is formed to have the same impurity concentration and same impurity concentration profile in the direction vertical to the semiconductor substrate 1 as that of the memory cell transistor 2. The channel diffusion layer 19 has a higher impurity concentration than the channel diffusion layer 18 and has a greater depth than the channel diffusion layer 18. The gate electrode 13 of select transistor 3 has a height substantially equal to the height of the gate electrode 7 of memory cell transistor 2. The inter-gate insulating film 9, 15 is formed of, e.g. an ONO (Oxide-Nitride-Oxide) film that is a multilayer film of silicon oxide film, a silicon nitride film and a silicon oxide film. Thus, in the select transistor 3, a potential can be supplied from the outside to the charge storage layer 14. In other words, the select transistor 3 functions like an ordinary MOSFET. Furthermore, the stacked gate structure of the select transistor 3 is the same as that of the memory cell transistor 2 except for the presence of the opening portion 16.

When this embodiment is applied to a flash memory, the length of the gate electrode 7 of memory cell transistor 2 and the length of the channel region interposed between the source/drain regions 4 and 5 are, in usual cases, less than the length of the gate electrode 13 of select transistor 3 and the length of the channel region interposed between the source/drain regions 5 and 12. Of course, depending on product specifications, the channel length of the select transistor 3 may becomes less than the channel length of the memory cell transistor 2. In other words, the length of the gate electrode 7 of memory cell transistor 2 may be greater than that of the gate electrode 13 of select transistor 3. Besides, depending on product specifications, the channel length of select transistor 3 may be made equal to the channel length of memory cell transistor 2.

The size of the opening portion 16 is about half the length of the gate electrode 13 of select transistor 3. For example, if the length of gate electrode 13 is about 0.3 μm, the length of opening portion 16 is about 0.15 μm. If the length of gate electrode 7 of memory cell transistor 2 is about 0.15 μm, the channel length thereof is about 0.15 μm and the length of the entire channel region of select transistor 3 is about 0.3 μm. The length of the channel region 11 of memory cell transistor 2 is made less than the sum of the lengths of channel diffusion layer 18 and channel diffusion layer 19 of the select transistor 3.

The length of the channel diffusion layer 19 of select transistor 3 can be varied by controlling the length of the opening portion 16. In addition, the impurity concentration of the channel diffusion layer of select transistor 3 can freely be set by controlling the dosage of ions implanted below the gate electrode 13 through the opening portion 16, independently of the memory cell transistor 2. The impurity concentration of the channel region of the select transistor 3 is, e.g. about $10^{17}/cm^3$.

Figure 2B:
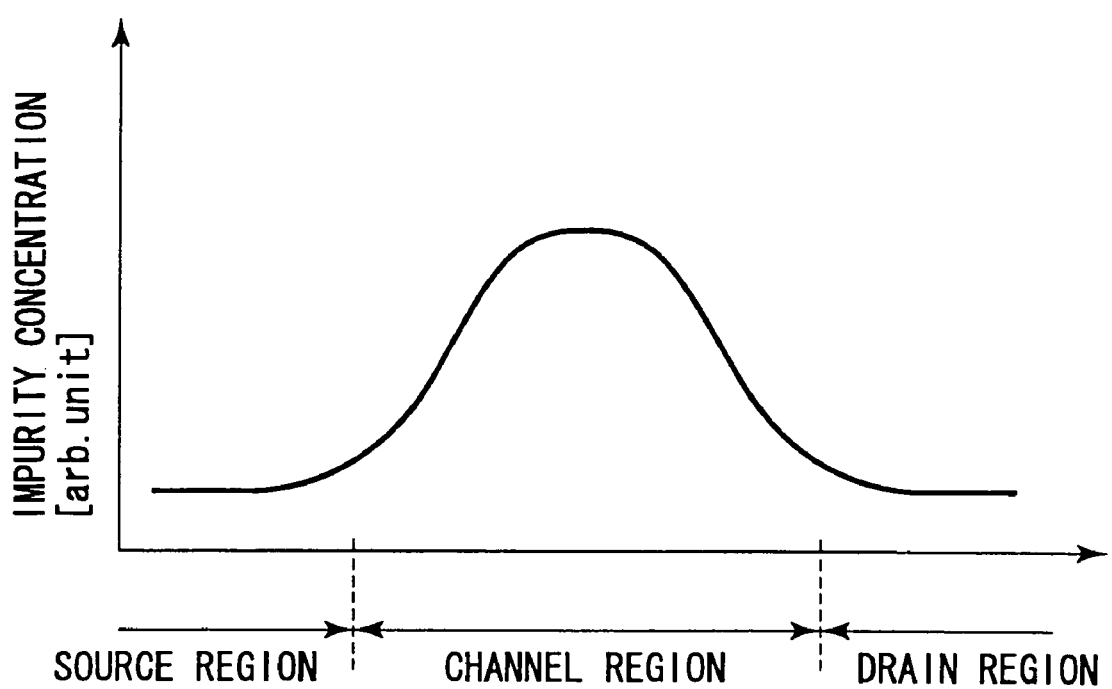
FIG. 2B is a graph showing a p-type impurity concentration profile in a channel region of select transistor shown in FIG. 2A.

FIG. 2B shows a p-type impurity concentration profile in a channel region of select transistor 3 shown in FIG. 2A. As is shown in FIG. 2B, the impurity concentration takes a maximum value in a region just below the opening portion 16, i.e. a region including a central portion of the channel region.

As has been described above, according to the semiconductor device of the present embodiment, the memory cell transistor with a gate length of about 0.15 μm or less can be realized. Moreover, the select transistor with a gate length of about 0.3 μm or less can be realized. Accordingly, a semiconductor memory device with a finer structure than in the prior art can be provided. While increasing the degree of miniaturization, the cut-off characteristics of the select transistor can be enhanced. The select transistor and memory cell transistor, which have different channel-length-dependency of threshold voltage, can be realized. In FIG. 2A, the impurity regions 4, 5, 11, 12, 18 and 19 of the respective transistors 2 and 3 may be formed in well regions formed near the surface of the semiconductor substrate 1.

Figure 3A:
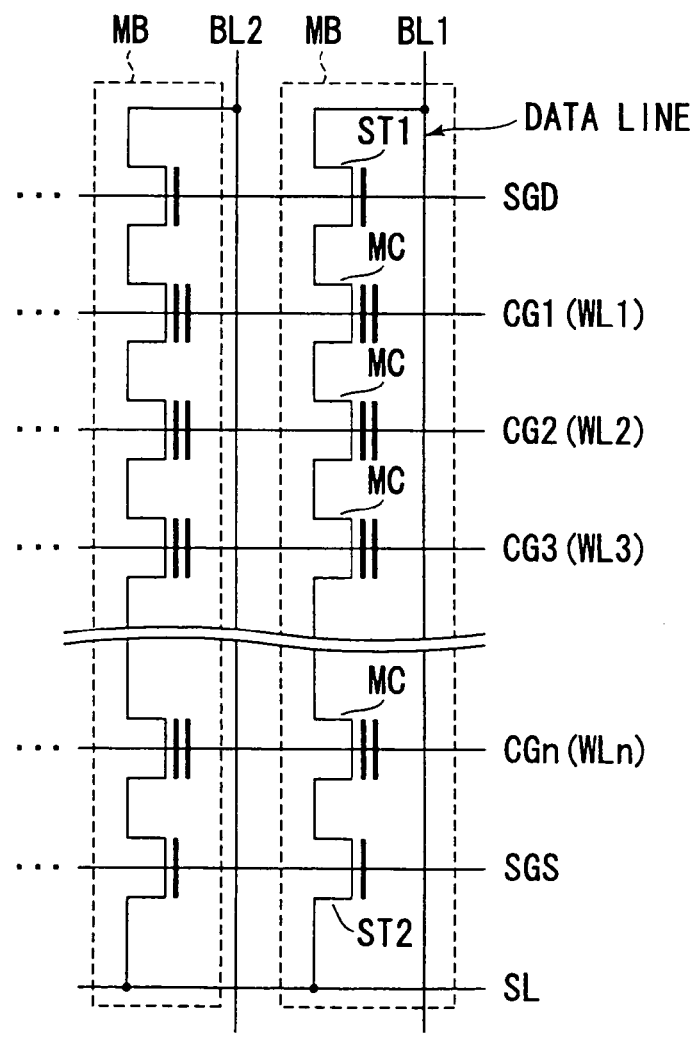
FIG. 3A is a circuit diagram of a NAND type flash memory according to the first embodiment of the invention.

FIG. 3A is a circuit diagram of a memory cell array of a NAND type flash memory using the semiconductor device shown in FIG. 2A. A non-volatile memory cell MC shown in FIG. 3A has the same structure as the memory cell transistor 2 in FIG. 2A. Select transistors ST1, ST2 shown in FIG. 3A have the same structure as the select transistor 3 in FIG. 2A.

As is shown in FIG. 3A, the memory cell array comprises a plurality of memory blocks MB (NAND cells). Each memory block MB includes an n-number (n is a natural number) of memory cells MC, a drain-side select transistor ST1 and a source-side select transistor ST2. Adjacent ones of memory cells MC share their source and drains, and the current paths of the memory cells MC are connected in series. The select transistor ST1 is connected to one end (drain side) of the current path of the series-connected memory cells MC, and the select transistor ST2 is connected to the other end of the current path.

The gates of the memory cells MC are connected to control gate lines CG1 to CGn (word lines WL1 to WLn). The gate of the drain-side select transistor ST1 is connected to a select gate line SGD, and the gate of the source-side select transistor ST2 is connected to a select gate line SGS.

The source of the select transistor ST1 in each memory block is connected to an associated one of bit lines BL1 to BLm (m is a natural number) that are data lines. The source of the source-side select transistor ST2 is connected to a common source line SL.

Although not shown, a plurality of memory blocks MB are provided in a direction along the bit lines BL1 to BLm, and a plurality of memory blocks MB are connected to each of the bit lines BL1 to BLm. Similarly, memory blocks MB are provided for the respective bit lines BL1 to BLm in a direction along the control gate lines CG1 to CGn.

Both the select transistors ST1 and ST2 are not always necessary. Only one of them may be provided if the memory cell blocks MB can be selected.

Figure 3B:
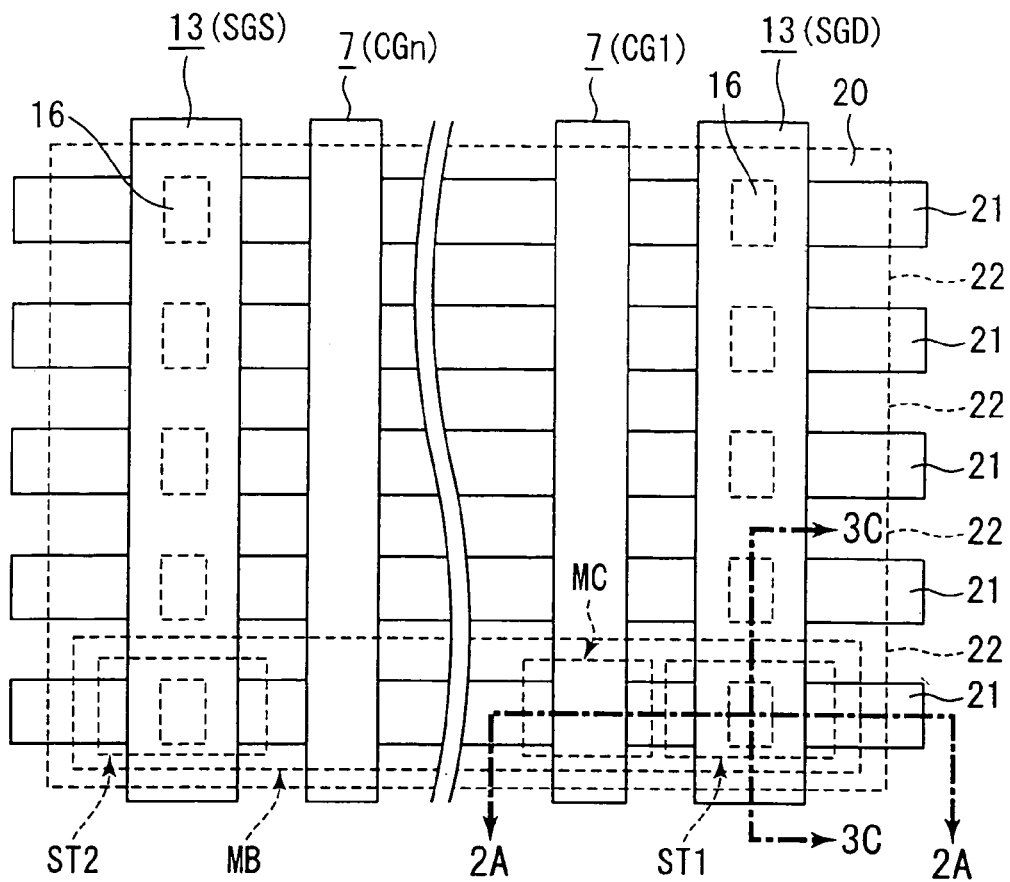
FIG. 3B is a plan view of the NAND type flash memory according to the first embodiment of the invention.

The planar configuration of the memory cell array will now be described with reference to FIG. 3B. FIG. 3B is a plan view of the memory cell array shown in FIG. 3A.

As is shown in FIG. 3B, a plurality of active areas 21 in stripe shapes are provided in parallel. Source and drain regions are formed in the active areas 21. Element isolation regions 22 are provided between the active areas 21. Gate electrodes 7 of memory cells MC are provided in stripe shapes in parallel so as to intersect the striped active areas 21 at right angles. Moreover, gate electrodes 13 of a pair of select transistors ST1 and ST2 are provided in parallel to the gate electrodes 7 of memory cells MC so as to sandwich the gate electrodes 7.

In FIG. 3B, impurities are implanted in a region 20 of the semiconductor substrate. Parts of the region 20 function as channel regions of the memory cell transistors. Opening portions 16, as described with reference to FIG. 2A, are provided near intersections between the gate electrodes 13 of select transistors ST1 and ST2 and the active areas 21. Impurities are doped in the silicon substrate through the opening portions 16. The regions doped with impurities function as channel regions of the select transistors ST1 and ST2, and have an impurity concentration different from that of the channel regions of the memory cell transistors.

The sources and drains of adjacent ones of the memory cells MC are commonly connected. Thus, more than two memory cells MC have their current paths connected in series, and constitute one memory block (NAND cell).

Figure 3C:
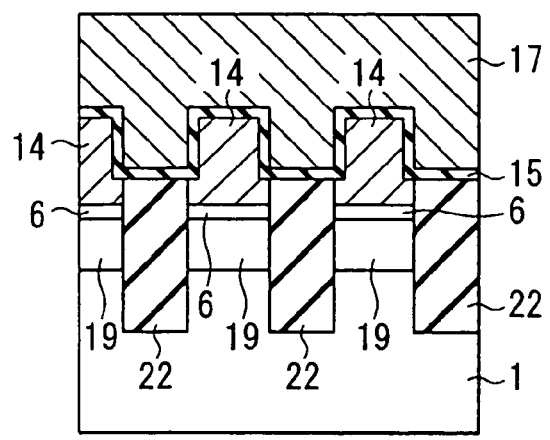
FIG. 3C is a cross-sectional view taken along line 3C—3C in FIG. 3B.

A cross-sectional structure of the above-described memory cell array will now be described. FIG. 2A is a cross-sectional view taken along line 2—2 in FIG. 3B, so a description of the cross-sectional structure, as viewed along line 2—2, is omitted. FIG. 3C is a cross-sectional view taken along line 3C—3C in FIG. 3B, which shows, in particular, a cross-sectional structure of the select transistor ST1.

As is shown in FIG. 3C, the element isolation regions 22 are provided in the semiconductor substrate 1, with their top portions projecting from the surface of the substrate 1. The channel diffusion layers 19 are formed on the surface of the semiconductor substrate 1 between the element isolation regions 22. The gate insulating films 6 are formed on the channel diffusion layers 19. The material of the gate insulating film 6 is, e.g. silicon oxide or oxy-nitride. The charge storage layers 14 are provided on the gate insulating films 6, with their top portions being at a level higher than the top surfaces of element isolation regions 22. The inter-gate insulating film 15 is formed on the top surfaces of charge storage layers 14 and element isolation regions 22. The control gate electrode 17 is formed on the inter-gate insulating film 15. The control gate electrodes 17 and charge storage layers 14 of select transistors ST1 and ST2 are electrically connected to constitute select gate lines SGD and SGS.

Figure 3D:
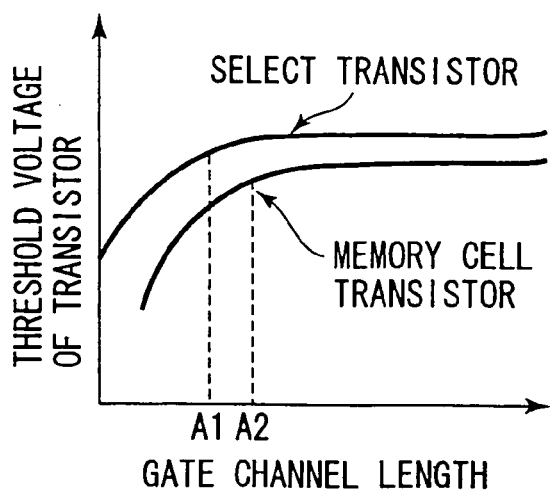
FIG. 3D is a graph showing a variation in threshold voltage relative to a channel length, in a select transistor and a memory cell transistor included in the NAND flash memory according to the first embodiment of the invention.

FIG. 3D is a graph showing the channel-length-dependency of the threshold voltages of the select transistor ST1 (ST2) and memory cell transistor MC according to this embodiment of the invention. As mentioned above, the impurity concentration in the channel region of the select transistor ST1, ST2 differs from that in the channel region of the memory cell transistor MC. As a result, as shown in FIG. 3D, the threshold voltage of the memory cell transistor MC is lower than that of the select transistor ST1, ST2 when the channel length is equal.

If the channel length decreases to a certain level, the threshold voltage of each transistor sharply decreases. In FIG. 3D, the threshold voltage of the select transistor ST1, ST2 sharply decreases at point A1, and that of the memory cell transistor at point A2 (A2>A1). The characteristics of the transistors are unstable in the region where the channel length is less than point A1, A2. Thus, in advance of shipment of finished products, the channel lengths of the select transistor ST1, ST2 and memory transistor MC are designed to be greater than points A1 and A2.

The number of memory cell transistors within the memory cell array is very large, compared to that of other transistors. Miniaturization of semiconductor memory devices necessitates reduction in channel length of memory cell transistors. The channel length of the select transistor is designed to be greater than that of the memory cell transistor. Thereby, the threshold voltage of the select transistor can be made higher than that of the memory cell transistor, and thus the select transistor can have necessary cut-off characteristics.

According to the present embodiment, as described above, the miniaturization of select transistors can be realized. More specifically, the select transistor can be reduced in size by virtue of the provision of the opening portion 16 between the charge storage layer 14 and control gate 17 of the select transistor. Making use of the opening portion 16, ion implantation in the channel region of the select transistor can be effected in a self-alignment manner. In the prior art, when impurity ions are implanted in the channel regions of a memory cell transistor and a select transistor in different steps, there are restrictions on the precision of fine processing, such as the need for dimenision control or alignment error control in lithography. In the present embodiment, these restrictions are cleared by the self-aligned ion implantation. Therefore, the select transistor can be reduced in size.

The select transistor has a channel length different from that of the memory cell transistor. This makes the threshold voltage of the select transistor different from that of the memory cell transistor. In addition, the impurity concentration in the channel region of the select transistor is controlled independently of the memory cell transistor by the ion implantation using the opening portion 16. Thus, the cut-off characteristics of the select transistor can be enhanced. Moreover, the degradation in switching characteristics of the select transistor due to the reduction in channel length can be compensated. Therefore, a short-channel effect in the select transistor can be suppressed. Accordingly, the memory cell array can be further miniaturized with a higher integration density.

Besides, the impurity concentration in the channel region of the select transistor can be made higher than that in the channel region of the memory cell transistor, while the channel length of the select transistor is made greater than the channel length of the memory cell transistor. Hence, the threshold voltage of the select transistor is made higher than that of the memory cell transistor. Therefore, the semiconductor memory device including the select transistor with necessary cut-off characteristics (current cut-off characteristics) can be realized.

The opening portion 16 is provided between the floating gate 14 and control gate 17, whereby the impurity concentration in the channel region of the select transistor is made different from that in the channel region of the select transistor. Therefore, a miniaturized semiconductor memory device can be realized, which includes a select transistor with a channel region of a required high impurity concentration and a memory cell transistor with a channel region of a low impurity concentration suitable for miniaturization. Accordingly, the memory cell transistor can be furnished with improved characteristics such as data write characteristics, data hold characteristics, and resistance to read-out stress.

A method of manufacturing the semiconductor device with the above-described structure will now be described with reference to FIGS. 4A and 4B through FIGS. 15A and 15B. FIGS. 4A and 4B through FIGS. 15A and 15B are cross-sectional views successively illustrating the steps of fabricating a NAND type flash memory. FIG. 4A through FIG. 15A show cross-sections taken along line 2—2 in FIG. 3B, and FIG. 4B through FIG. 15B show cross-sections taken along line 3C—3C in FIG. 3B.

As is shown in FIGS. 4A and 4B, a sacrificial silicon oxide film 30 is formed on a semiconductor substrate 1, e.g. a p-type silicon substrate. The sacrificial silicon oxide film 30 serves to protect the surface of the semiconductor substrate 1 from damage due to ion implantation. Then, depending on cases, impurities are ion-implanted in the semiconductor substrate 1. The implanted impurities are activated to form a p-well or a double well comprising an n-well and a p-well.

Then, an ion-implanted layer 31 is formed by effecting channel ion implantation on the surface of the semiconductor substrate 1, or the surface of the well when the well is formed. Impurities to be implanted are changed in accordance with the conductivity type of the memory cell transistor or select transistor. For example, when the conductivity of the transistor is n-type, p-type impurities such as boron are introduced. The ion implantation is performed for channel control of the transistor. The ion implantation is effected simultaneously on formation regions of the memory cell transistor and select transistor.

Subsequently, as shown in FIGS. 5A and 5B, the sacrificial silicon oxide film 30 is removed, and a gate insulating film 6 is formed on the semiconductor substrate 1. A floating gate electrode layer 32 is then formed by depositing, e.g. polysilicon as an electrode material of the floating gate electrode. Since the floating gate electrode layer 32 needs to be electrically conductive, the polysilicon to be used is, e.g. phosphorus-doped polysilicon. Of course, after undoped polysilicon is deposited, phosphorus may be ion-implanted. Then, a mask material 33 such as silicon nitride film ($Si_3N_4$) is formed on the floating gate electrode layer 32. The mask material 33 is used in order to form a element isolation region.

A resist (not shown) is coated on the mask material 33, and the resist is patterned to have a pattern of the element isolation region by photolithography. Using the patterned resist as a mask, the mask material 33 is patterned. Further, using the patterned mask material 33 as a mask, the floating gate electrode layer 32, gate insulating film 6 and semiconductor substrate 1 are etched. The etching is usually performed by RIE (Reactive Ion Etching). Thereby, a trench (not shown) for the element isolation region, which extends from the surface of mask material 33 to the semiconductor substrate 1, is formed. The depth of the trench is, e.g. about 0.25 μm. The side bottom walls of the trench are oxidized at high temperatures to form thermal silicon oxide films thereon. These thermal oxide films are formed for the purposes of remedying a damage due to etching or protecting interfaces of the respective layers, or for other purposes. Silicon oxide films 34 for element isolation are deposited in the trenches by, e.g. CVD (Chemical Vapor Deposition). In this case, for instance, HDP-CVD (High Densety Plasma-CVD) is employed. Then, the deposited silicon oxide films 34 are planarized to make the top surface of the mask material 33 flush with the top surfaces of silicon oxide films 34. In this planarizing step, CMP (Chemical Mechanical Polishing) is usually used, but an etching-back method may alternatively be used. In the case of the planarization using CMP, the silicon nitride film that is the mask material 33 is used as a stopper film for CMP. Then, the silicon oxide film 34 is made denser by annealing. Thereby, the crystallinity of the silicon oxide films 34 is made closer to that of the thermal silicon oxide films, thereby making them into high-quality silicon oxide films. As a result, a structure as shown in FIGS. 6A and 6B is obtained.

In the following step shown in FIGS. 7A and 7B, the mask material 33 is removed. Top portions of the silicon oxide films 34 are etched away by means of RIE or wet etching. Thus, the formation of element isolation regions 22 is completed.

In FIGS. 8A and 8B, an inter-gate insulating film 35 is deposited on the exposed surfaces of the element isolation regions 22 and floating gate electrode layer 32. For instance, an ONO film is used as the inter-gate insulating film 35.

In FIGS. 9A and 9B, a mask material 36 is deposited on the inter-gate insulating film 35. The mask material 36 may be formed of, e.g. polysilicon or silicon oxide.

In FIGS. 10A and 10B, a resist 37 is coated on the mask material 36. The resist 37 is patterned by photolithography, thereby removing that portion of the resist 37 which corresponds to at least a portion of a channel formation region of the select transistor. As a result, an opening portion 38 is made.

As is shown in FIGS. 11A and 11B, that portion of the mask material 36, which is located just under the opening portion 38, is etched away by using the resist 37 as a mask. The step of etching the mask material 36 is effected by, e.g. Deep UV (Ultraviolet) lithography. This method employs a short-wavelength light source and thus realizes patterning with very high precision. Hence, an alignment error between the mask material 36 and opening portion 38 is limited to a minimum. Consequently, the inter-gate insulating film 35 is exposed at the bottom of the opening portion 38.

In FIGS. 12A and 12B, impurities are ion-implanted in that region of the semiconductor substrate 1, which is to become the channel region of the select transistor. Thus, a channel diffusion layer 19 is formed. In the ion implantation step, impurities are introduced into the substrate 1 via the inter-gate insulating film 35, floating gate electrode layer 32 and gate insulating film 6. The kind of impurities varies depending on the conductivity type of the select transistor. In the case of an n-channel type, boron may be used. In the case of a p-channel type, phosphorus may be used. The ion implantation is effected without removing the resist 37, since it serves as a buffer material for ion implantation.

In this step, the mask material 36 is present in the region where the memory cell transistor is to be formed. The thickness of the mask material 36 is set such that a energy of the implanted ion is decayed in the material 36 sufficiently. Consequently, the ions may be captured in the mask material 36 of the memory cell transistor. At the same time, the acceleration energy for ion implantation is adjusted such that the ions may penetrate the floating gate electrode layer 32 and reach the semiconductor substrate 1 in the region where the select transistor is to be formed.

As shown in FIGS. 13A and 13B, the inter-gate insulating film 35 under the opening portion 38 is etched away. The ion implantation for forming the channel diffusion layer 19, as illustrated in FIGS. 12A and 12B, may be performed after etching the inter-gate insulating film 35 in this step. However, if the ion implantation is performed with the inter-gate insulating film 35 remaining, the surface of the floating gate electrode layer 32 is protected from contamination. The reason is that the inter-gate insulating film 35 functions as a protection film for the floating gate electrode layer 32.

Figure 14A:
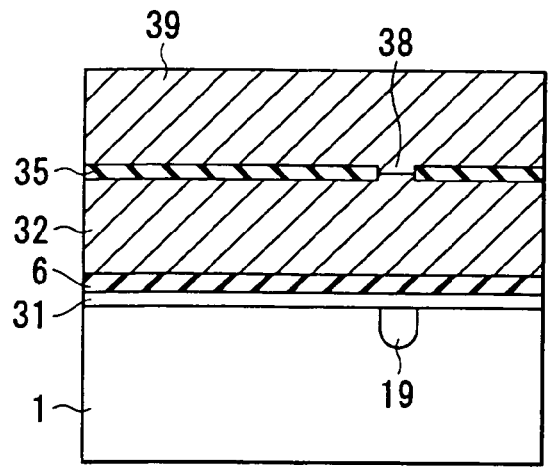
Figure 14B:
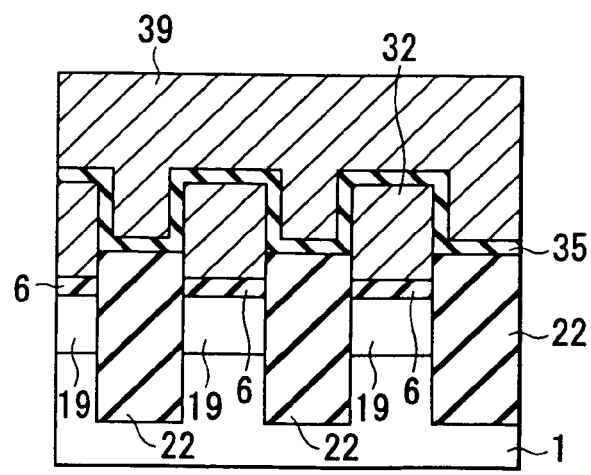

In FIGS. 14A and 14B, the mask material 36 is removed. A control gate electrode material 39 is formed on the inter-gate insulating film 35. The control gate electrode material 39 includes, e.g. a polysilicon film and a metal silicide film such as a WSi (Tungsten Silicide). Of course, it may comprise only the polysilicon film, without the metal silicide film. Alternatively, a multi-layer structure including a polysilicon film and a metal silicide film may be formed in the memory cell transistor formation region, while a structure comprising only the polysilicon film may be formed in the select transistor formation region.

Figure 15A:
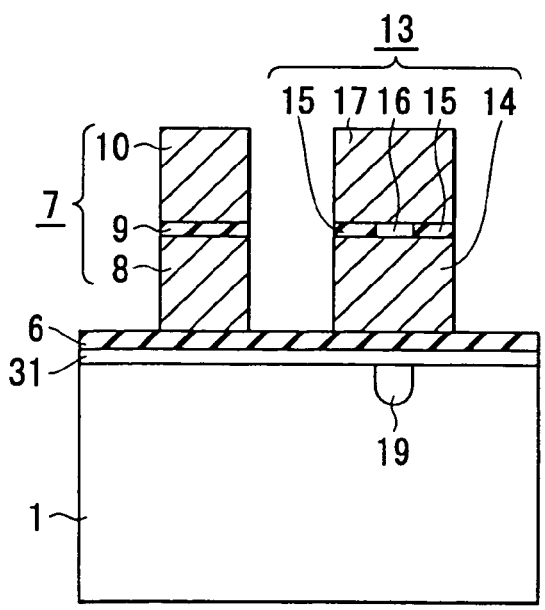
Figure 15B:
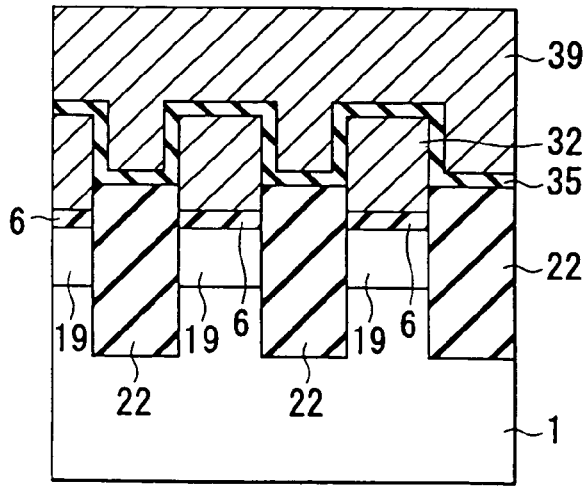

Then, the control gate electrode material 39, inter-gate insulating film 35 and floating gate electrode layer 32 are patterned using photolithography and anisotropic etching such as RIE. As a result, as shown in FIGS. 15A and 15B, the gate electrode 7 of the memory cell transistor MC, which includes the charge storage layer 8, inter-gate insulating film 9 and control gate 10, is formed. In addition, the gate electrode 13 of select transistor ST1, ST2, which includes the charge storage layer 14, inter-gate insulating film 15 and control gate 17, is completely formed. When the control gate electrode material 39 is formed as the polysilicon film in the step of FIGS. 14A and 14B, the silicide film may be formed using salicide (Self-Aligned Silicide) after the patterning in this step.

Thereafter, using the stacked-structured gate electrodes 7 and 13 as masks, impurities are ion-implanted in the semiconductor substrate 1. Thus, the source/drain regions 4, 5 and 12 are formed in the semiconductor substrate 1, and the structure shown in FIGS. 2 and 3C is obtained.

As has been described above, according to the semiconductor device fabrication method of this embodiment, a part of the inter-gate insulating film 15, which electrically isolates the charge storage layer 14 and control gate 17, is removed. This process is applied to the gate electrodes of transistors in a peripheral control system or to the gate electrodes of select transistors in the memory cell array. By this process, the charge storage layer 14 and control gate 17 are electrically connected. However, if the condition below is satisfied, impurities can be ion-implanted in the semiconductor substrate through the floating gate in this process.

The condition is that the impurities are captured in the mask material and do not reach the charge storage layer in the memory cell transistor, while the impurities penetrate the charge storage layer and gate insulating film and reach the semiconductor substrate in the select transistor.

Under this condition, the memory cell transistor and select transistor can have channel regions with different impurity concentrations, and these channel regions can be formed to have necessary characteristics for the respective transistors. The characteristics of the respective transistors can be enhanced without additional fabrication steps of lithography, etc. Moreover, the process can be carried out in a self-alignment manner.

Thus, the select transistor with the channel region, which includes a region having an impurity concentration different from the impurity concentration in the channel region of the memory cell transistor, can be formed by the self-alignment process. As has been described in the BACKGROUND OF THE INVENTION, it becomes difficult carry out the conventional method wherein the ion implantation to the channel region of the memory cell transistor and select transistor respectively are performed in different steps. In this case, the channel region of the select transistor has the same impurity concentration profile in the direction vertical and horizontal to the surface of the semiconductor substrate as that of the memory cell transistor. In the method according to the embodiment, the step for implanting ions to the semiconductor substrate through the opening portion 16 is carried out in the select transistor. Consequently, the select transistor has the channel region which has the impurity concentration profile in the direction vertical and horizontal to the semiconductor substrate different to that of the memory cell transistor. In the select transistor, part of ions implanted in the channel ion implantation remains in the gate insulating film 6. This region includes a region just under the opening portion 16.

This embodiment covers not only n-channel transistors, but also p-channel transistors. The impurities to be ion-implanted for channel control of the memory cell transistor and select transistor are not limited to boron. Alternatively, phosphorus, for instance, may be used. In addition, an increase in the number of lithography steps is prevented by performing ion implantation after the opening portion 16 has been formed in the inter-gate insulating film 15.

According to the semiconductor device and the fabrication method thereof in this embodiment, impurity ions are implanted in the channel region using the opening portion corresponding in position to the channel region of the select transistor. Therefore, misalignment in the channel ion implantation can effectively be prevented.

Ion implantation in the channel region of the select transistor is performed in the state in which the memory cell transistor is covered with the mask. Thus, the impurity concentration in the channel region of the memory cell transistor can be set independently of the channel impurity concentration in the select transistor.

In the present embodiment, channel regions, etc. are formed in the semiconductor substrate 1. Alternatively, a well may be formed by implanting impurities at a low concentration in the active area of the semiconductor substrate 1. Channel regions may be formed in the well. The NAND cell includes, e.g. eight transistors sandwiched by two select gates. However, the number of transistors may be chosen between 8 and 32, for example. The advantages of this embodiment are conspicuous when the inter-gate distance of adjacent memory cell transistors is about 0.2 μm or less. This embodiment is directed to the case where the semiconductor substrate 1 is of p-type and the source/drain region is of n-type. Needless to say, the semiconductor substrate 1 may be of n-type and the source/drain region of p-type. The structure of the select transistor according to the embodiment is applicable to MOS transistors included in the peripheral circuits.

As has been described above, according to the present embodiment, channel impurity ion implantation is not effected through the gate insulating film of the memory cell transistor. Therefore, the characteristics of the non-volatile memory with the floating gate structure, in particular, are not degraded. In the prior art, when the gate insulating film has been degraded by the ion implantation, the degradation affects data write/erase characteristics and data storage characteristics of the memory cell transistor, even if it hardly affects transistors in the peripheral control system. However, in the present embodiment, the possibility of degradation of the memory cell transistor can be eliminated.

The manufacturing method of this embodiment does not require lithography steps of forming very fine patterns in order to form the channel region. This method requires only conventional lithographic techniques indispensable for connection between the floating gate and control gate in the select transistor. Accordingly, neither the manufacturing cost nor the number of fabrication steps increases. Only with the addition of the ion implantation step, can the semiconductor device be obtained, which has the memory cell array that includes the select transistor having the channel region formed independently of the memory cell transistor and has fine memory cell transistors arranged at high density.

The present embodiment is effectively applicable not only to the case where the select transistors and memory cell transistors are regularly arranged as in the NAND type flash memory, but also to various cell structures. This embodiment can be carried out with a large degree of freedom, without such a restriction that the relationship between the distance between adjacent gate electrodes and the stacked structure of the gate electrodes should meet a specific geometrical condition for ion implantation.

Figure 16A:
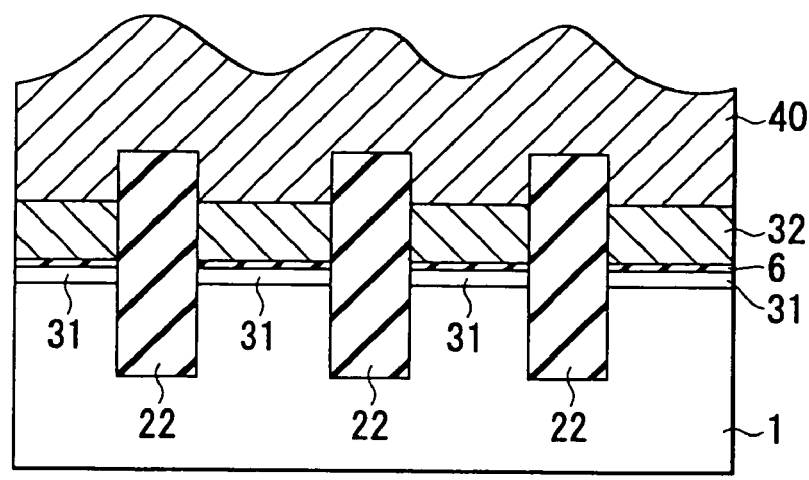
FIGS. 16A and 16B are cross-sectional views successively illustrating some manufacturing steps of a NAND type flash memory according to a first modification of the first embodiment.
Figure 16B:
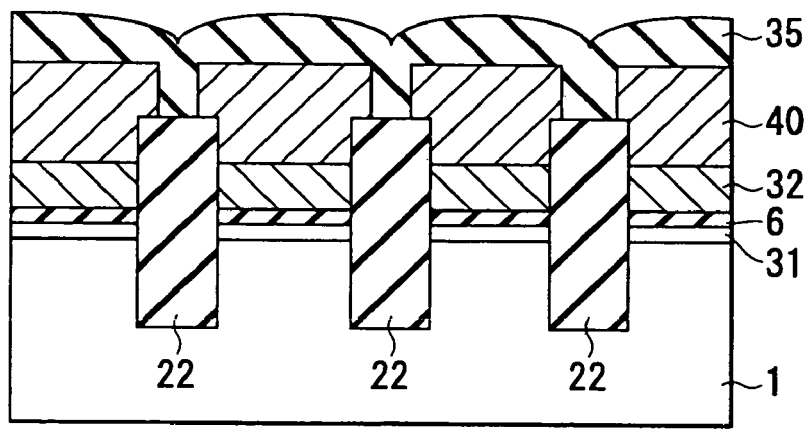

FIGS. 16A and 16B are cross-sectional views successively illustrating manufacturing steps of a semiconductor device according to a first modification of the first embodiment. These Figures show, in particular, cross-sectional structures of a NAND type flash memory, as viewed in the direction of the control gate line CG.

A structure shown in FIGS. 7A and 7B is formed through the fabrication steps according to the above-described first embodiment. Then, as shown in FIG. 16A, a polysilicon layer 40 doped with, e.g. phosphorus is deposited on the floating gate electrode layer 32 and element isolation regions 22. The polysilicon layer 40 is then planarized by CMP.

Subsequently, as shown in FIG. 16B, the polysilicon layer 40 is patterned by photolithography and etching. As a result, as shown in FIG. 16B, the polysilicon layer 40 is isolated on the element isolation regions 22 in the direction of the control gate line CG, and end portions of the isolated portions are left on the element isolation regions 22. In this manner, a charge storage layer with a multi-layer structure comprising the floating gate electrode layer 32 and polysilicon layer 40 is obtained. Then, an inter-gate insulating film 35 of, e.g. ONO film, is deposited on the polysilicon layer 40 and element isolation regions 22.

Thereafter, the same steps as illustrated in FIGS. 9A and 9B and the following Figures in connection with the first embodiment are carried out.

According to the manufacturing method of this modification, after the mask material 33 is removed, the polysilicon layer 40 is additionally deposited. Thereby, the thickness of the charge storage layer is made greater than in the first embodiment, and the distance between the top surface of the charge storage layer and the top surface of the element isolation region is increased. Compared to the first embodiment, the surface area of the charge storage layer, which contacts the inter-gate insulating film, is enlarged. Specifically, the surface area increases by a degree corresponding to the distance between the top surface of the charge storage layer and the top surface of the element isolation region. Accordingly, the charge storage capacity in the memory cell section increases. Therefore, the memory capacity of the memory cell section can be adjusted by controlling the thickness of the charge storage layer, that is, by controlling the thickness of the polysilicon layer 40.

Figure 16C:
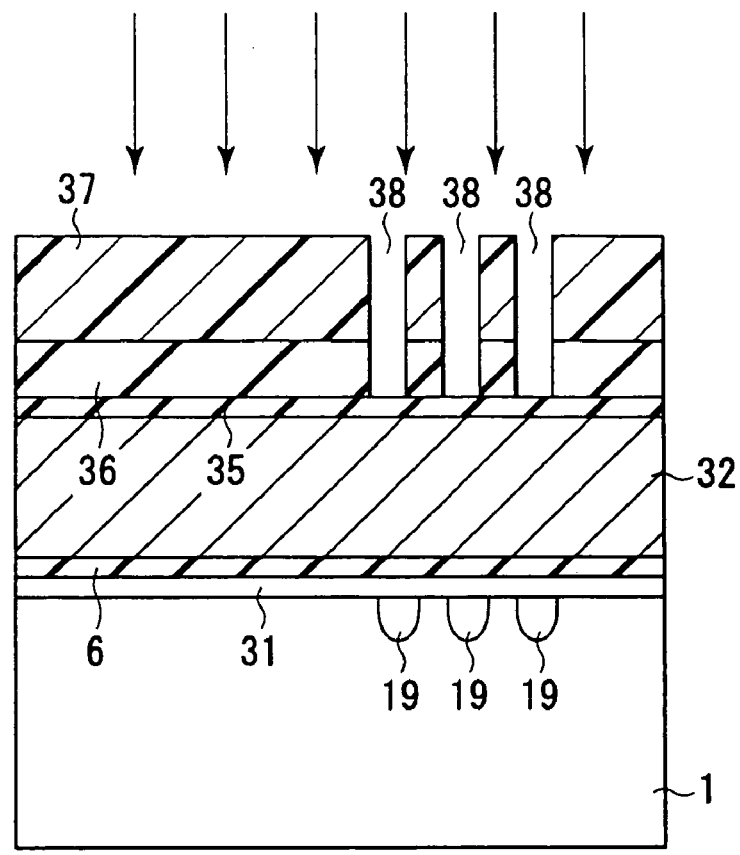
FIGS. 16C and 16D are cross-sectional views successively illustrating fabrication steps of a semiconductor device according to a second modification of the first embodiment.
Figure 16D:
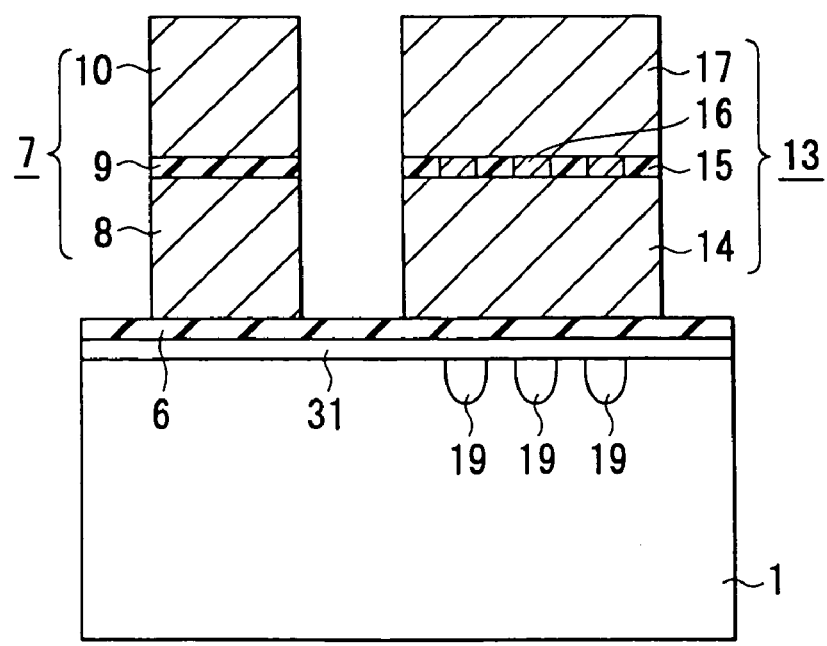

FIGS. 16C and 16D are cross-sectional views successively illustrating fabrication steps of a semiconductor device according to a second modification of the first embodiment. FIGS. 16C and 16D show, in particular, a cross-sectional structure of a NAND type flash memory, as viewed along the bit line BL.

A structure as shown in FIG. 9A is formed through the steps described in connection with the first embodiment. Then, through the steps illustrated in FIGS. 10A and 11A, the resist 37 and mask material 36 are patterned to form the opening portion 38. In the first embodiment, one opening portion 38 is formed for one select transistor. In this modification, however, a plurality of opening portions 38 are formed for one select transistor as shown in FIG. 16C. Then, impurities are ion-implanted via the opening portions 38 into the semiconductor substrate 1. As a result, a plurality of channel diffusion layers 19 are formed in the semiconductor substrate 1.

Subsequently, a gate electrode 13 as shown in FIG. 16D is formed through the steps illustrated in FIGS. 13A and 14A. As is shown in FIG. 16D, the gate electrode 13 has three connection portions 16.

A plurality of connection portions 16 may be formed, as in this modification. In FIG. 16D, a plurality of channel diffusion layers 19 are provided. In usual cases, these channel diffusion layers become one body through many thermal steps. As a result, this channel region, too, has an impurity concentration profile as shown in FIG. 2B.

Figure 17:
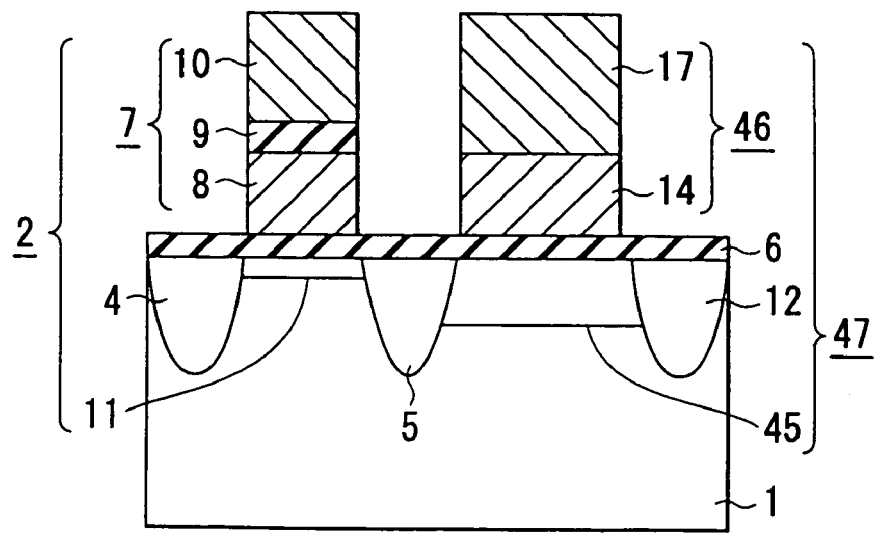
FIG. 17 is a cross-sectional view of a NAND type flash memory according to a third modification of the first embodiment of the invention.

FIG. 17 is a cross-sectional view of a semiconductor device according to a third modification of the first embodiment of the invention. FIG. 17 shows, in particular, a cross-sectional structure of a NAND type flash memory, as viewed in the direction of the control gate line CG.

In the first embodiment, in the steps of FIGS. 10A and 10B, the opening portion 38 is formed to be less than the gate electrode 13. In the third modification, however, the opening portion 38 is formed to be equal in size to the gate electrode of the select transistor, as shown in FIG. 17. Thus, a select transistor 47 having a gate electrode 46, in which the inter-gate insulating film 35 is completely removed, is formed. Moreover, a channel region 45 having the same length as the gate electrode 46 is formed.

Figure 18:
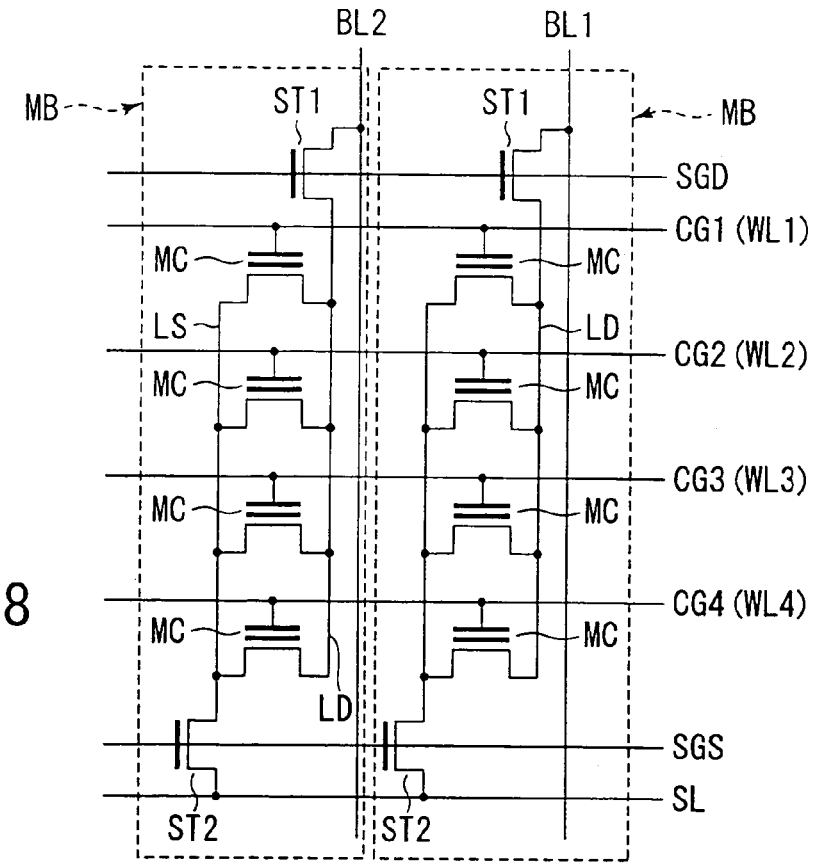
FIG. 18 is a circuit diagram of an AND type flash memory according to a second embodiment of the present invention.

A semiconductor device according to a second embodiment of the invention will now be described with reference to FIG. 18. FIG. 18 is a circuit diagram of a memory cell array of an AND type flash memory. In the second embodiment, the semiconductor device of the first embodiment is applied to an AND type flash memory, instead of a NAND type flash memory.

The memory cell array, as shown in FIG. 18, comprises a plurality of memory blocks MB (AND cells). Each memory block MB comprises an n-number (n is a natural number; n=4 in FIG. 18) of parallel-connected memory cell transistors MC, a drain-side select transistor ST1, and a source-side select transistor ST2. The memory cell transistors MC comprise gates connected to control gate lines CG1 to CG4 (WL1 to WL4), respectively; drains commonly connected to a local drain line LD; and sources commonly connected to a local source line LS. The drain-side select transistor ST1 comprises a gate connected to a select gate line SGD, a drain connected to bit lines BL1, BL2, . . . , and a source connected to the local drain line LD. The source-side select transistor ST2 comprises a gate connected to a select gate line SGS, a drain connected to the local source line LS, and a source connected to a common source line SL. The drain-side and source-side select transistors ST1 and ST2 have the same structure as the select transistor described in connection with the first embodiment.

The structure shown in FIGS. 2 and 17 according to the first embodiment is directly applicable to the memory cell transistor MC and select transistor ST1, ST2 of the AND type flash memory. In addition, the manufacturing method illustrated in FIGS. 4A and 4B through FIGS. 16A and 16B is directly applicable. With the flash memory of the second embodiment, like the first embodiment, the flash memory can be reduced in size, while the cut-off characteristics of the select transistor are enhanced.

The first and second embodiments are generally applicable to non-volatile semiconductor memory devices including select transistors. In addition, these embodiments are applicable not only to semiconductor memory devices but also to MOS transistors in peripheral circuits. Moreover, these embodiments are applicable to memory-embedded semiconductor devices.

Figure 19A:
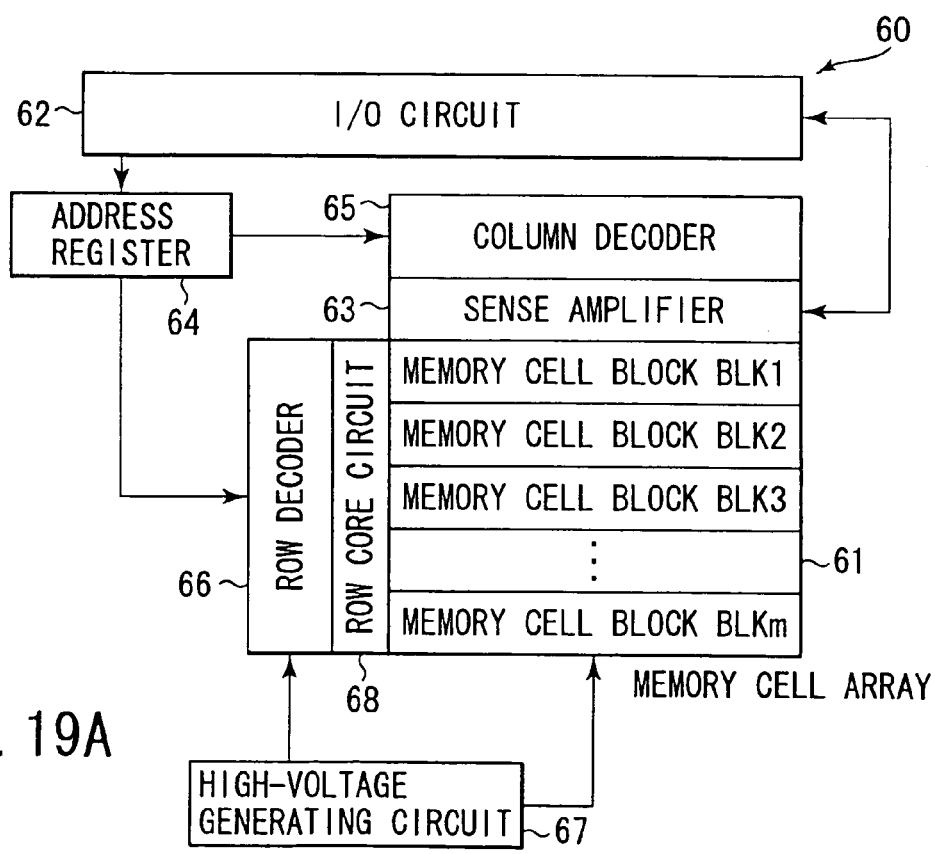
FIG. 19A is a block diagram showing a part of the internal structure of a NAND type flash memory according to a third embodiment of the invention.
Figure 19B:
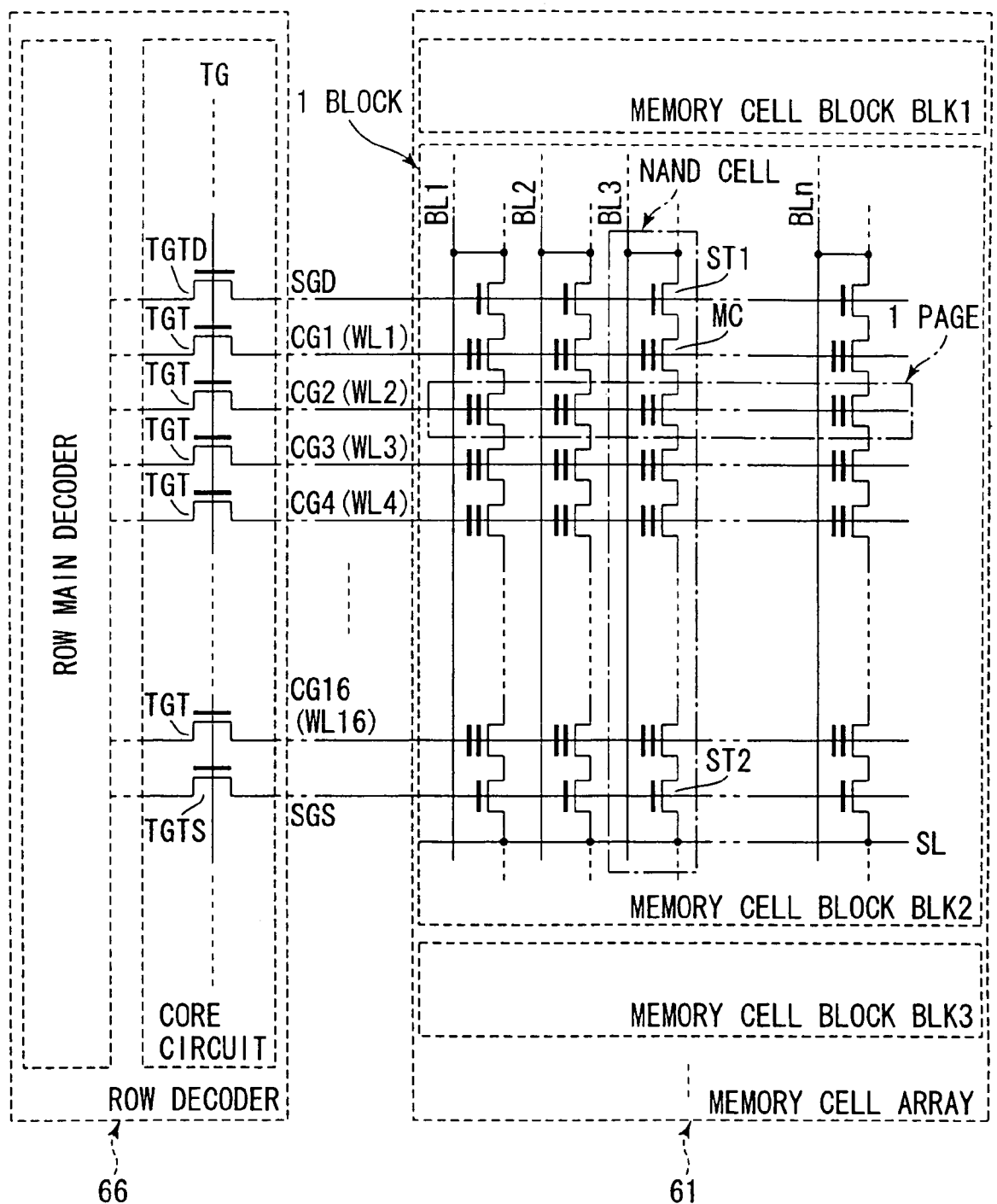
FIG. 19B is a circuit diagram of a memory cell array and a row core circuit included in the NAND flash memory according to the third embodiment.

A semiconductor device according to a third embodiment of the present invention will now be described, taking a NAND type flash EEPROM as an example. FIG. 19A is a block diagram schematically showing the structure of the NAND type flash EEPROM. FIG. 19B is a circuit diagram of a memory cell array and a row core circuit.

As is shown in FIGS. 19A and 19B, a NAND type flash EEPROM 60 comprises a memory cell array 61, an input/output (I/O) circuit 62, a sense amplifier 63, an address register 64, a column decoder 65, a row decoder 66, and a high-voltage generating circuit 67.

The memory cell array 61 is divided into an m-number of memory cell blocks BLK1 to BLKm. In each of the memory cell blocks BLK1 to BLKm, NAND cells as shown in FIG. 19B are arranged. Each NAND cell includes a plurality of memory cells MC (the number of memory cells being 16 in FIG. 19B, but not limited). The memory cells MC are connected in series such that adjacent ones of them share their sources and drains. The drain at one end of the NAND cell is connected to a bit line (data line), BL1 to BLn, via a select transistor ST1. The source at the other end of the NAND cell is connected to a source line SL via a select transistor ST2. Select gate lines SGD and SGS extending in the row direction of the memory cell array 61 are connected to the select transistors ST1 and ST2 in the same rows. Similarly, word lines WL1 to WL16 extending in the row direction of the memory cell array 61 are connected to control gate lines CG1 to CG16 of the memory cells in the same rows. In the case of the NAND type flash EEPROM, one page is formed by n-bit memory cells MC connected to one word line WL. In turn, 16 pages form one of the memory cell blocks BLK1 to BLKm. Data write/read for the memory cell array 61 is effected in units of a page, while data erase is effected in units of a block.

The I/O circuit 62 receives various commands, address signals, and cell data to be written. The I/O circuit 62 outputs data that has been read out of the memory cell array 61 and latched in the sense amplifier 63. Row address signals and column address signals input to the I/O circuit 62 are supplied to the address register 64 and latched therein.

The column address signal latched in the address register 64 is supplied to the column decoder 65 and decoded. The row address signals latched in the address register 64 (block address signal, page address signal) are supplied to the row decoder 66 and decoded.

The sense amplifier 63 latches cell data that has been input to the I/O circuit 62 at the time of write. At the time of read-out, the sense amplifier 63 latches cell data that has been read out to the associated bit line from the selected memory cell block, BLK1 to BLKm, in the memory cell array 61.

The row decoder 66 comprises a row main decoder circuit (not shown) and a row core circuit (row sub-decoder) 68 associated with the memory cell blocks BLK1 to BLKm. The row core circuit 68 is a circuit for supplying predetermined voltages to the select gate lines SGD and SGS and 16 word lines WL1 to WL16 of the selected block. The row core circuit 68 comprises transfer gate transistors TGTD, TGTS and TGT. The gate electrodes TG of the transfer gate transistors TGTD, TGTS and TGT are commonly connected. The drains of these transfer gate transistors are connected to the select gate lines SGD and SGS and control gate lines CG1 to CG16. Voltages corresponding to page address signals are supplied from the row main decoder circuit to the sources of these transfer gate transistors.

The high-voltage generating circuit 67 supplies high voltages to the row decoder 66 and memory cell array 61 in accordance with input command signals.

Figure 19C:
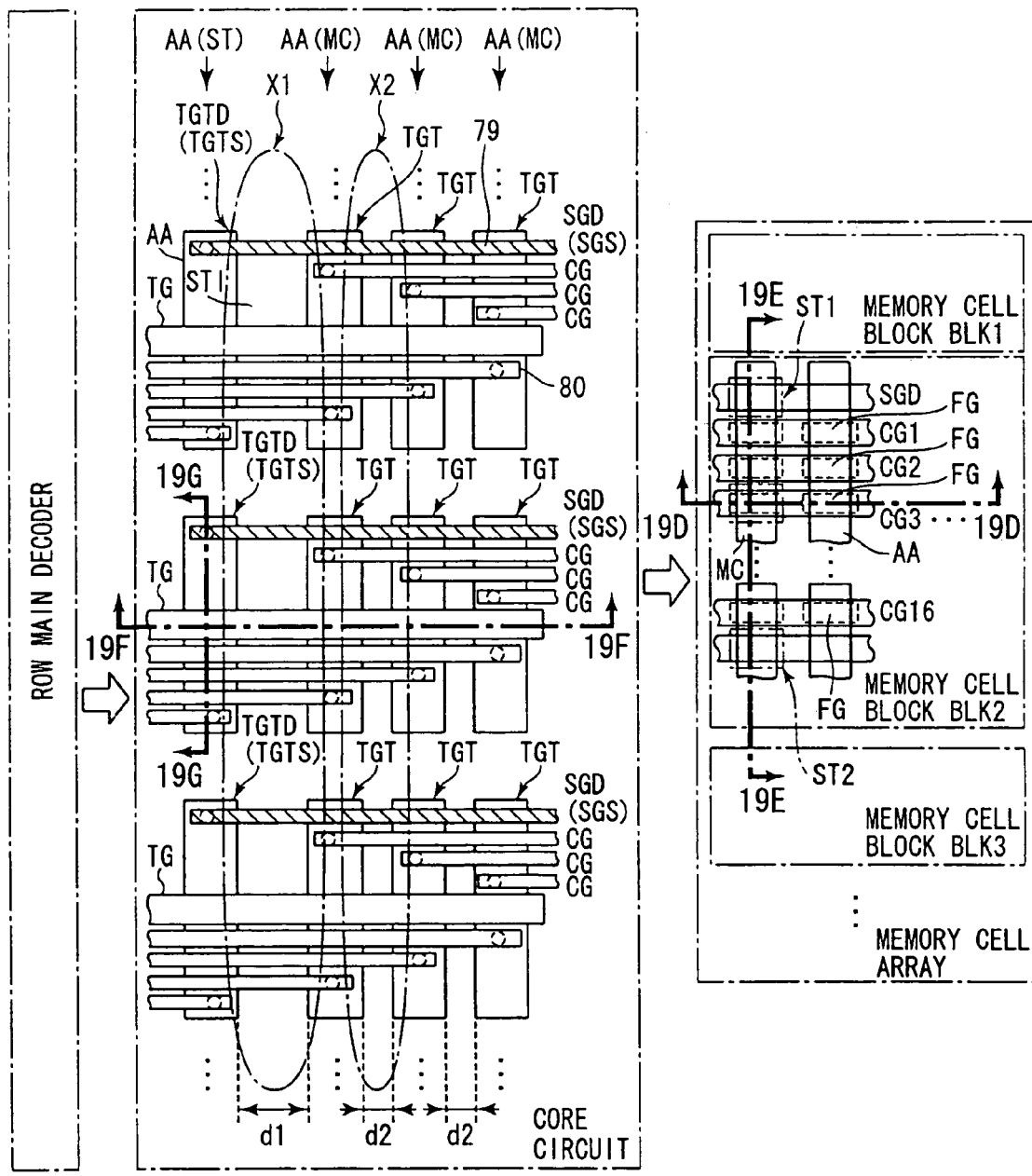
FIG. 19C is a plan view of a memory cell array and a row core circuit included in the NAND flash memory according to the third embodiment.

The planar patterns and cross-sectional configurations of the memory cell array and row core circuit will now be described with reference to FIGS. 19C to 19G. FIG. 19C is a plan view of the row core circuit and NAND cell. FIGS. 19D and 19E are cross-sectional views of the NAND cell. FIG. 19D is a cross-sectional view taken along line 19D—19D in FIG. 19C, and FIG. 19E is a cross-sectional view taken along line 19E—19E in FIG. 19C. FIGS. 19F and 19G are cross-sectional views of the row core circuit. FIG. 19F is a cross-sectional view taken along line 19F—19F in FIG. 19C, and FIG. 19G is a cross-sectional view taken along line 19G—19G in FIG. 19C.

The structure of the memory cell array will first be described. As is shown in FIGS. 19C to 19E, a plurality of strip-like active areas AA are provided in a silicon substrate 70. Element isolation regions STI are provided between adjacent active areas AA. A polysilicon layer 72, which will become a floating gate FG of the memory cell MC and parts of select gates SGD and SGS of the select transistors ST1 and ST2, is formed on the active areas AA with a gate insulating film 71 interposed therebetween. The gate insulating film 71 is formed of, e.g. a silicon oxide film or oxy-nitride film. A polysilicon layer 74 is provided over the active area AA and element isolation region STI in a direction crossing the active area AA. The polysilicon layer 74 is provided over the polysilicon layer 72, with an inter-gate insulating film 73 interposed. The inter-gate insulating film 73 is formed of, e.g. a three-layer ONO film comprising a silicon oxide film, a silicon nitride film and a silicon oxide film, or a single-layer film of a silicon oxide film, or a two-layer ON film or NO film comprising a silicon oxide film and a silicon nitride film. The polysilicon layer 74 will become the word lines WL1 to WL16 of memory cells MC and parts of the select gate lines SGD and SGS of select transistors ST1 and ST2. Impurity diffusion layers 75, which will become sources and drains, are provided in the silicon substrate 70. Thus, the memory cells MC and select transistors ST1 and ST2 are formed. The polysilicon layers 72 and 74 of select transistors ST1 and ST2 are electrically connected in a shunt region (not shown), etc.

An interlayer insulating film 76 is provided over the silicon substrate 70 so as to cover the memory cells MC and select transistors ST1 and ST2. In the interlayer insulating film 76, a metal wiring layer 77 is provided. The metal wiring layer 77 is connected via a contact hole Cl to the drain region of the selector transistor ST1 having the select gate line SGD. The metal wiring layer 77 serves as the bit line BL. Moreover, an interlayer insulating film 78 is provided on the interlayer insulating film 76 so as to cover the bit line BL.

As described above, an n-number of NAND cells each including 16 memory cells MC and selector transistors ST1 and ST2 are arranged in the direction of the word lines, with the element isolation regions STI interposed. Thereby, one memory cell block BLK is formed. The memory cell array comprises an m-number of memory cell blocks BLK1 to BLKm.

The word lines WL1 to WL16 in the memory cell array with the above structure are connected to the control gate lines CG1 to CG16. The control gate lines CG1 to CG16 and select gate lines SGD and SGS are led out to the row core circuit 68.

The structure of the row core circuit 68 will now be described with reference to FIGS. 19C, 19F and 19G.

As is shown in the Figures, a plurality of active areas AA are provided in a matrix in a region adjoining the memory cell array on the silicon substrate 70. Element isolation regions STI are provided between adjacent active areas AA. Transfer gate transistors TGTD, TGTS, TGT, TGT, ..., are individually formed on the electrically isolated active areas AA, respectively. Each transfer gate transistor comprises a gate insulating film 71 provided on the active area AA, a polysilicon layer 72 provided on the gate insulating film 71, an inter-gate insulating film 73 provided on the polysilicon layer 72, a polysilicon layer 74 provided on the inter-gate insulating film 73, and impurity diffusion layers 75 provided in the active area AA. The polysilicon layers 72 and 74 are a gate electrode TG of the transfer gate transistor, and both are electrically connected on the active area AA.

The number of columns of active areas AA in the row core circuit 68 is, e.g. four. The gate electrodes TG of the four transfer gate transistors provided in the active areas AA in the same row are commonly connected.

The impurity diffusion layers (drain regions) 75 of the transfer gate transistors TGTD, TGTS, TGT, TGT, ..., are connected to associated select gate lines SGD and SGS and control gate lines CG1 to CG16. In other words, the select gate lines SGD and SGS and control gate lines CG1 to CG16 are led out to the active areas AA, on which the associated transfer gate transistors are provided, by shunt wiring elements 79 (M0) provided in the interlayer insulating film 76, and are connected to the impurity diffusion layers 75 of the associated transfer gate transistors via contact holes C2. In addition, the impurity diffusion layers (source regions) 75 of the transfer gate transistors TGTD, TGTS, TGT, TGT, ..., are connected to the row main decoder by a metal wiring layer 80. Via the metal wiring layer 80, voltage is applied from the row main decoder to the source regions of the transfer gate transistors.

In the row core circuit 68 with the above structure, the transfer gate transistors TGTD and TGTS connected to the select gate lines SGD and SGS are formed in the active area AA formed at the endmost column within the row core circuit. In the example shown in FIG. 19C, the transfer gate transistors TGTD and TGTS are provided in the active areas AA arranged in the column closest to the row main decoder within the row core circuit 68. The group of active areas AA in this column closest to the row main decoder is referred to as an active area group AA(ST).

Only the transfer gate transistors TGT, which are connected to the control gate lines CG1 to CG16, are provided in the active areas AA arranged in the first to third columns on the side of the memory cell array 61. In other words, the transfer gate transistors TGTD and TGTS are not formed in the active areas AA of the second to fourth columns, as counted from the row main decoder side. The groups of active areas AA of the second to fourth columns, as counted from the row main decoder side, are referred to as active area groups AA(MC).

A width d1 of the element isolation region STI between the active area group AA(ST) and the adjacent active area group AA(MC) is greater than a width d2 of the element isolation region STI between adjacent active area groups AA(MC) (d1>d2).

As described above, the row core circuit 68 is formed and connected to the memory cell array 61 and row main decoder.

Figures 20A, 21B:
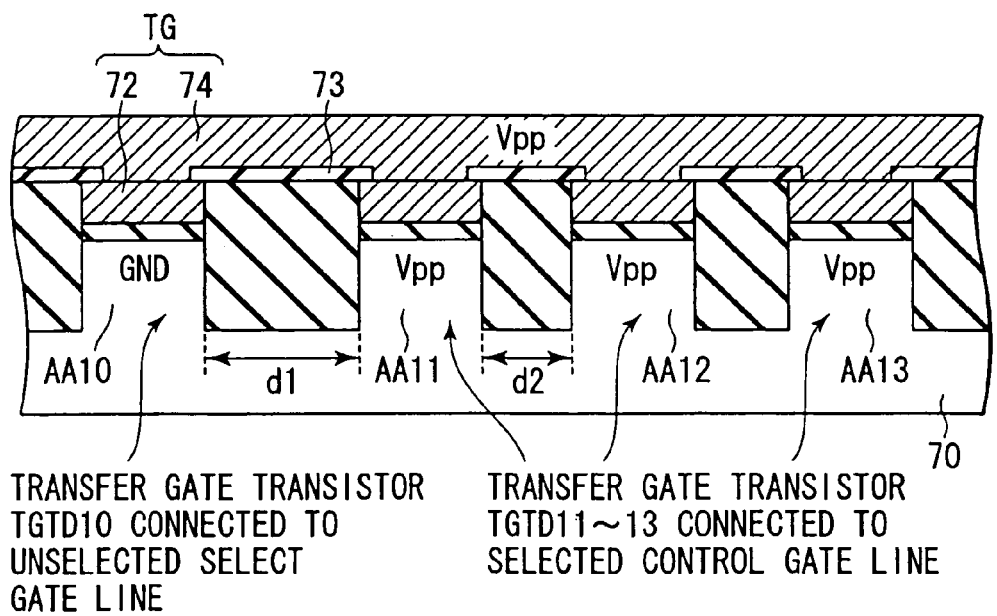
FIG. 20A is a table showing gate voltages of transistors in the write, read and erase modes of the NAND type flash memory according to the third embodiment of the invention.
FIG. 21B is a cross-sectional view taken along line 21B—21B in FIG. 21A.
Figures 20B, 20C, 20D:
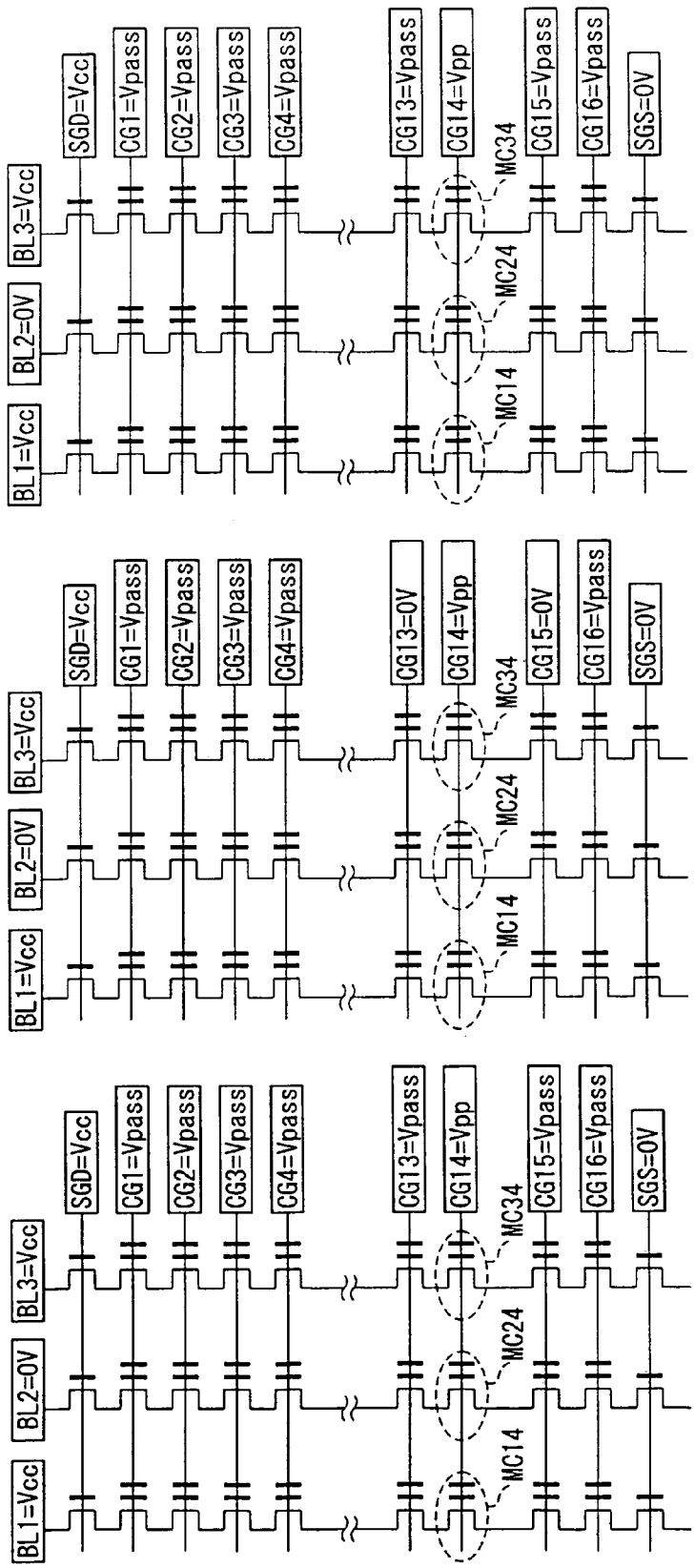
FIG. 20B through FIG. 20D are circuit diagrams of a NAND type flash memory according to the first embodiment of the invention.

The operation of the NAND type flash EEPROM will now be described in brief with reference to FIG. 20A. FIG. 20A is a table showing the relationship between potentials of the select gate lines and control gate lines in the write, read and erase modes of the NAND type flash memory. As mentioned above, the write and read for the memory cell array 61 are effected in units of a page, and the erase is effected in units of a block. The data write operation will first be described, taking a SB (Self Boost) method by way of example, referring to FIG. 20B. FIG. 20B is a circuit diagram of a NAND type flash memory in the write mode.

The data write is successively effected from the memory cell MC remotest from the bit line BL. In the following description, assume that data is to be written in memory cells MC14, MC24 and MC34 connected to a control gate line CG14, as shown in FIG. 20B. To begin with, a voltage Vpp (e.g. 20V) is applied to the gate electrodes TG of all transfer gate transistors corresponding to the selected memory cell block, BLK1 to BLKm. Thereby, the transfer gate transistors TGTD, TGTS, TGT, TGT, . . . , are turned on. Then, the row main decoder applies a write voltage Vpp (e.g. 20V) to the source regions of the transfer gate transistors TGT, TGT, . . . , which are connected to memory cells MC to be selected. The row main decoder applies an intermediate potential Vpass (e.g. 7V) to the source regions of the other (unselected) transfer gate transistors. Furthermore, voltages Vcc (e.g. 3V) and 0V are applied to the source regions of the transfer gate transistors TGTD and TGTS. In the state in which voltage Vcc is applied to the select gate line SGD of the select transistor ST1, Vpp to the control gate line CG14 of the selected memory cell, Vpass to the control gates CG1 to CG13, CG16 of the unselected memory cell, and 0V to the select gate line SGS of select transistor ST2, the bit lines BL1 to VL3 are supplied with 0V or intermediate potential Vcc (e.g. 3V) in accordance with data. When 0V is applied to the bit line BL, this potential is transferred to the drain of the selected memory cell MC24, and electrons are injected in the floating gate FG. Thereby, the threshold voltage of the selected memory cell transistor is shifted to the positive side. This state is the state in which data "0" is written. On the other hand, when intermediate potential Vcc is applied to the bit lines BL1, BL3, no injection of electrons into the floating gates FG of the memory cells MC14, MC34 substantially occurs and the threshold voltage does not change and remains at a negative level. This state is the state in which data "1" is written. The data write is simultaneously effected for all memory cells MC that share the control gate line CG.

Aside from the SB method, there are known an LSB (Local Self Boost) method and an ESB (Erased area Self Boost) method as data write methods. These methods are devised to prevent erroneous data write to memory cells connected to a unselected bit line. FIGS. 20C and 20D are circuit diagrams of NAND type flash memories in the write mode using the LSB method and ESB method, respectively.

The LSB method will now be described referring to FIGS. 20A and 20C. Assume that data "0" is written in the memory cell MC24 alone. In the LSB method, a voltage of 0V is applied to unselected control gate lines CG13 and CG15 adjacent to the selected gate line CG14. In the other respects, the LSB method is the same as the SB method. Since the potential of control gate lines CG13 and CG15 is 0V, the channel potential of the memory cell MC14, MC34 is in the floating state. A voltage Vpp is applied to the control gate line CG14. Accordingly, the channel potential of memory cell MC14, MC34 is boosted up to Vpp by capacitive coupling with the control gate line CG14. As a result, no electrons are injected in the floating gate FG, and data "1" is exactly written in the memory cell MC14, MC34.

The ESB method will now be described referring to FIGS. 20A and 20D. In the following description, too, assume that data "0" is to be written in the memory cell MC24. In the ESB method, a voltage of 0V is applied only to the unselected control gate line CG15 that is next to the selected control gate line CG14. An intermediate potential Vpass is applied to the other unselected control gate lines CG1 to CG13 and CG16. Paying attention to the bit line BL1, BL3 supplied with Vcc, the channel potential of the memory cell connected to the control gate line CG1 is boosted to Vcc+a by the capacitive coupling with the control gate line CG1. The same applies to the memory cells connected to the control gate lines CG2 to CG13. As a result, the channel potential of the memory cell connected to the control gate line CG14, too, becomes sufficiently higher than Vcc. Thus, no electrons are injected in the floating gate FG of memory cell MC14, MC34, and data "1" is exactly written in the memory cell MC14, MC34.

Also in the case of the NAND type flash memories using the LSB method and ESB method, a selected control gate line and an unselected control gate line are arranged not to be adjacent to each other within the row core circuit. However, it is inevitable that a selected state and an unselected state are present adjacently between the select gate line and the control gate line.

The data erase is effected for all bits in the block at the same time. To start with, a voltage Vpp (e.g. 20V) is applied to the gate electrodes TG of all transfer gate transistors corresponding to a selected one of the memory cell blocks BLK1 to BLKm. Thereby, the transfer gate transistors TGTD, TGTS, TGT, TGT, . . . , are turned on. Then, the row main decoder applies 0V to all the source regions of the transfer gate transistors TGT, TGT, . . . , which are connected to the memory cells MC. Thus, the potential of all control gates CG1 to CG16 is set at 0V. The potential of the select gate line SGD, SGS is in the floating state. In addition, the potentials of all control gate lines and select gate lines of the unselected blocks are in the floating state. In this state, a voltage of 20V is applied to the p-well (not shown) in the silicon substrate in which the NAND cells are formed. Thereby, electrons in the floating gates FG of all memory cells MC in the selected block are released to the p-well. As a result, the threshold voltage of the memory cell MC shifts to the negative side and data erase is effected. The potentials of the select gate lines in the selected block and the control gate lines and select gate lines in the unselected block are boosted up to about 20V by the capacitive coupling with the silicon substrate.

In the data read mode, like the data write and erase, a voltage Vpp (e.g. 20V) is applied to the gate electrodes TG of all transfer gate transistors corresponding to a selected one of the memory cell blocks BLK1 to BLKm. Thereby, the transfer gate transistors TGTD, TGTS, and TGT, TGT, . . . , are turned on. The row main decoder applies 0V to the source region of the transfer gate transistor TGT connected to the selected memory cell MC. At the same time, the row main decoder applies a read-out potential Vread (e.g. 5V) to the source regions of the transfer gate transistors TGT connected to the unselected memory cells MC. In addition, the row main decoder applies a voltage Vcc (e.g. 5V) to the source regions of the transfer gate transistors TGTD and TGTS. In the state in which the voltage Vread is applied to the control gate lines of the unselected memory cells, the voltage Vcc is applied to the select gate lines SGD and SGS of select transistors ST1 and ST2 and 0V is applied to the control gate lines of the selected memory cells, the read-out operation is performed by detecting whether current flows in the selected memory cells.

As has been described above, according to the NAND type flash EEPROM of this embodiment, the active areas AA, where the transfer gate transistors TGTD and TGTS are to be formed, are positioned in the column at the end portion of the row core circuit 68. Specifically, the region, where the transfer gate transistors TGTD and TDTS connected to the select gate lines and the transfer gate transistors TGT connected to the control gate lines are located adjacent to each other, is provided at the limited area within the row core circuit (region X1 in FIG. 19C). Consideration for the withstand voltage between the transfer gate transistors TGTD, TGTS and transfer gate transistors TGT needs to be given to only the region X1. Therefore, if only the width d1 of the region X1 is made greater than the width d2 of each of regions X2 where transfer gate transistors TGT are arranged adjacent to each other, the element isolation can be ensured within the row core circuit. In other words, the region X1 is the sole element isolation region STI that has to be widened to maintain the withstand voltage between the transfer gate transistors.

Figure 21A:
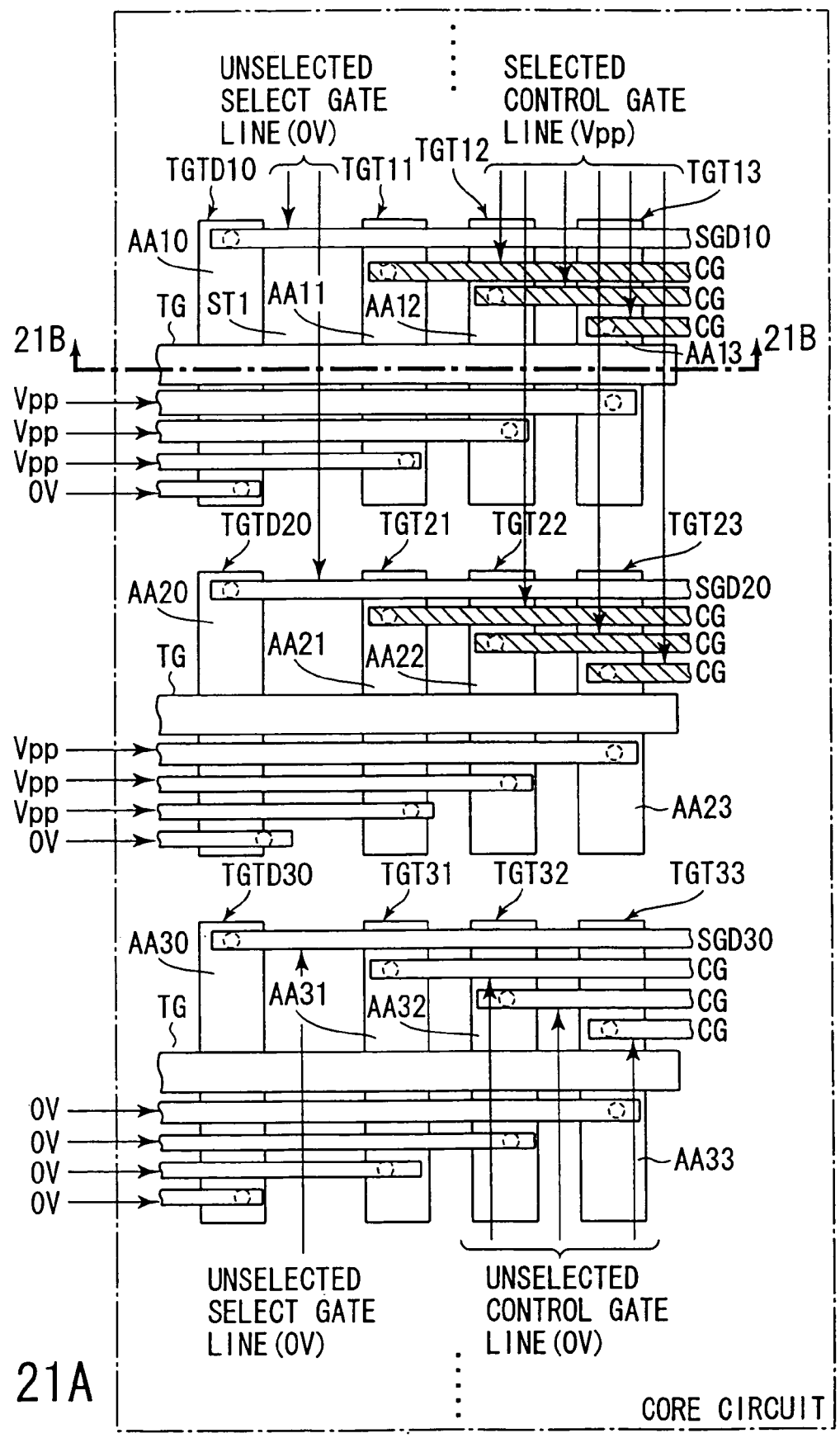
FIG. 21A is a plan view of a memory cell array and a row core circuit of the NAND type flash memory according to the third embodiment of the invention.

This point will further be described with reference to FIGS. 21A and 21B. FIG. 21A is a plan view of the row core circuit of the NAND type flash EEPROM, and FIG. 21B is a cross-sectional view taken along line 21B—21B in FIG. 21A. The transfer gate transistors arranged in the same row in the row core circuit do not necessarily correspond to the same memory block. The reason is that the control gate line connected to the transfer gate transistors TGT provided in the same row needs to be designed to avoid an adjacent occurrence of the selected state and unselected state of control gate lines.

Referring to FIG. 21A, assume that the select gate line SGD10 is connected to the select transistors in the unselected block. Then, 0V is applied to the active area AA10 (impurity diffusion layer 75) in which the transfer gate transistor TGTD10 connected to the select gate line SGD10 is provided. On the other hand, assume that the control gate lines CG11 to CG13 connected to the transfer gate transistors TGT11 to TGT13 provided in the same row as the transfer gate transistor TGTD10 have been selected for data write. Then, a high voltage Vpp is applied to the active areas AA11 to AA13 (impurity diffusion layer 75) where the transfer gate transistors TGT11 to TGT13 are provided.

Then, as shown in FIG. 21B, a potential difference of Vpp occurs between the active areas AA10 and AA11. Therefore, the width d1 of the element isolation region STI between the active areas AA10 and AA11 needs to be made greater than the width d2 of the element isolation region STI between the active areas AA11 and AA12 or between the active areas AA12 and AA13.

Then, assume that the select gate line SGD connected to the transfer gate transistor TGTD20 provided in the active area AA20 arranged in the row different from the row of the active area AA10 is also associated with the unselected block. Then, 0V is applied to the active area AA20. On the other hand, assume that the control gate lines CG21 to CG23 connected to the transfer gate transistors TGT21 to TGT23 provided in the same row as the transfer gate transistor TGTD20 have been selected for data write. Then, a high voltage Vpp is applied to the active areas AA21 to AA23 where the transfer gate transistors TGT21 to TGT23 are provided.

Similarly with FIG. 21B, a potential difference Vpp occurs between the active areas AA20 and AA21. Therefore, the width d1 of the element isolation region STI between the active areas AA20 and AA21 needs to be made greater than the width d2 of the element isolation region STI between the active areas AA21 and AA22 or between the active areas AA22 and AA23.

As has been described in "BACKGROUND OF THE INVENTION", the element isolation region between the transfer gate transistor connected to the select gate line and the transfer gate transistor connected to the control gate line cannot maintain element isolation, unless the width of this element isolation region is made greater than that of the element isolation region between the transfer gate transistors connected to the control gate line. In the prior art, as described above, the element isolation region between the transfer gate transistor connected to the select gate line and the transfer gate transistor connected to the control gate lines is present at random within the row core circuit.

However, in the present embodiment, the transfer gate transistors TGTD and TGTS connected to the select gate lines SGD and SGS are provided only in the active areas (AA10, AA20) in the same column at the end of the row core circuit. Therefore, no problem arises if the width of the element isolation region between the active areas (AA10, AA20, AA30, . . . ) in the first column in the row core circuit, which is closest to the row main decoder, and the active areas (AA11, AA21, AA31, . . . ) in the second column is increased. There is no need to increase the width of the other element isolation regions. Therefore, the insulation performance of the element isolation region can be sufficiently maintained, while the increase in area of the row core circuit is limited to a minimum.

Figure 22A:
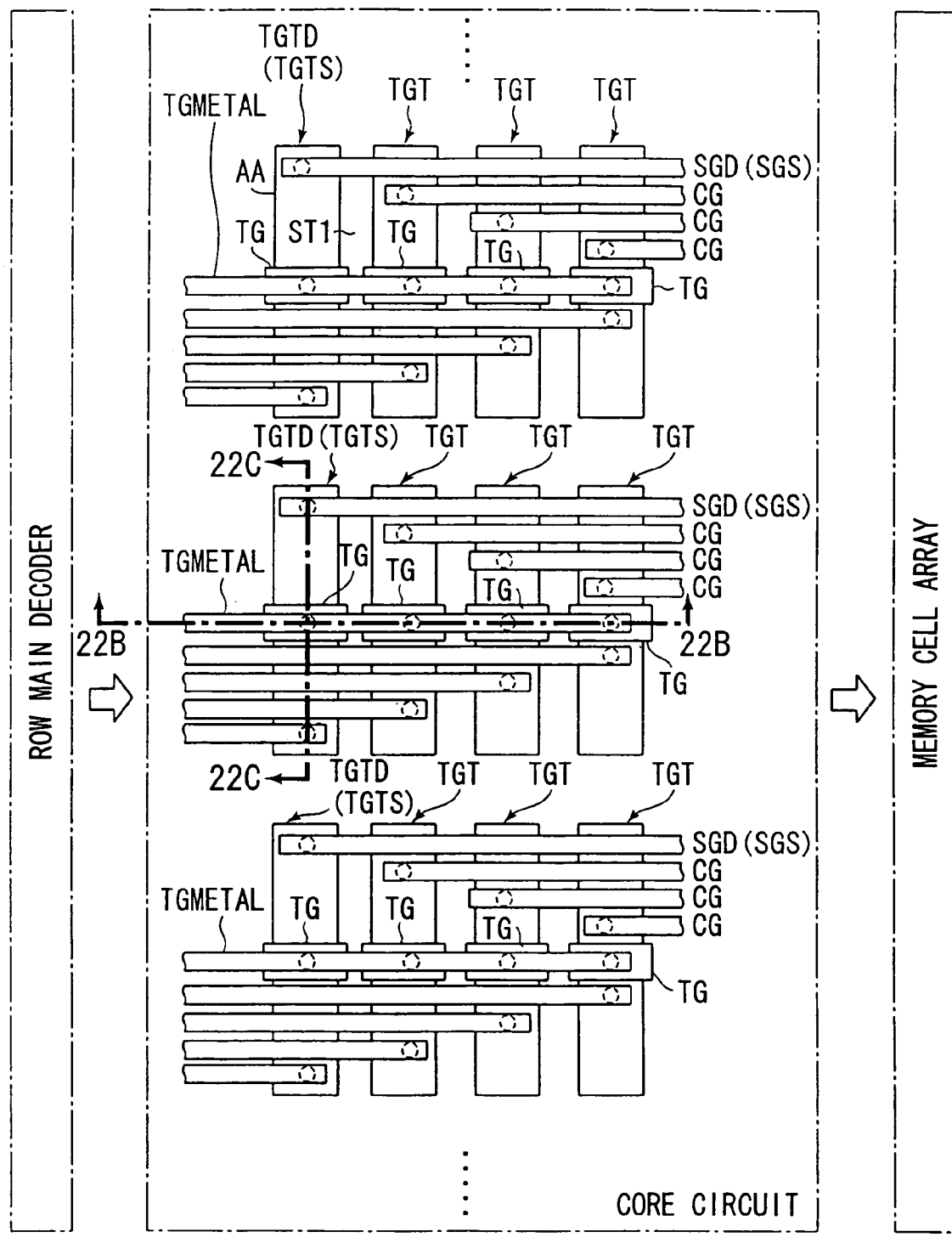
FIG. 22A is a plan view of a row core circuit of a NAND type flash memory according to a fourth embodiment of the invention.

A semiconductor device according to a fourth embodiment of the present invention will now be described with reference to FIGS. 22A to 22C. FIG. 22A is a plan view of a row core circuit. FIGS. 22B and 22C are cross-sectional views taken along lines 22B—22B and 22C—22C in FIG. 22A, respectively.

Figure 1A:
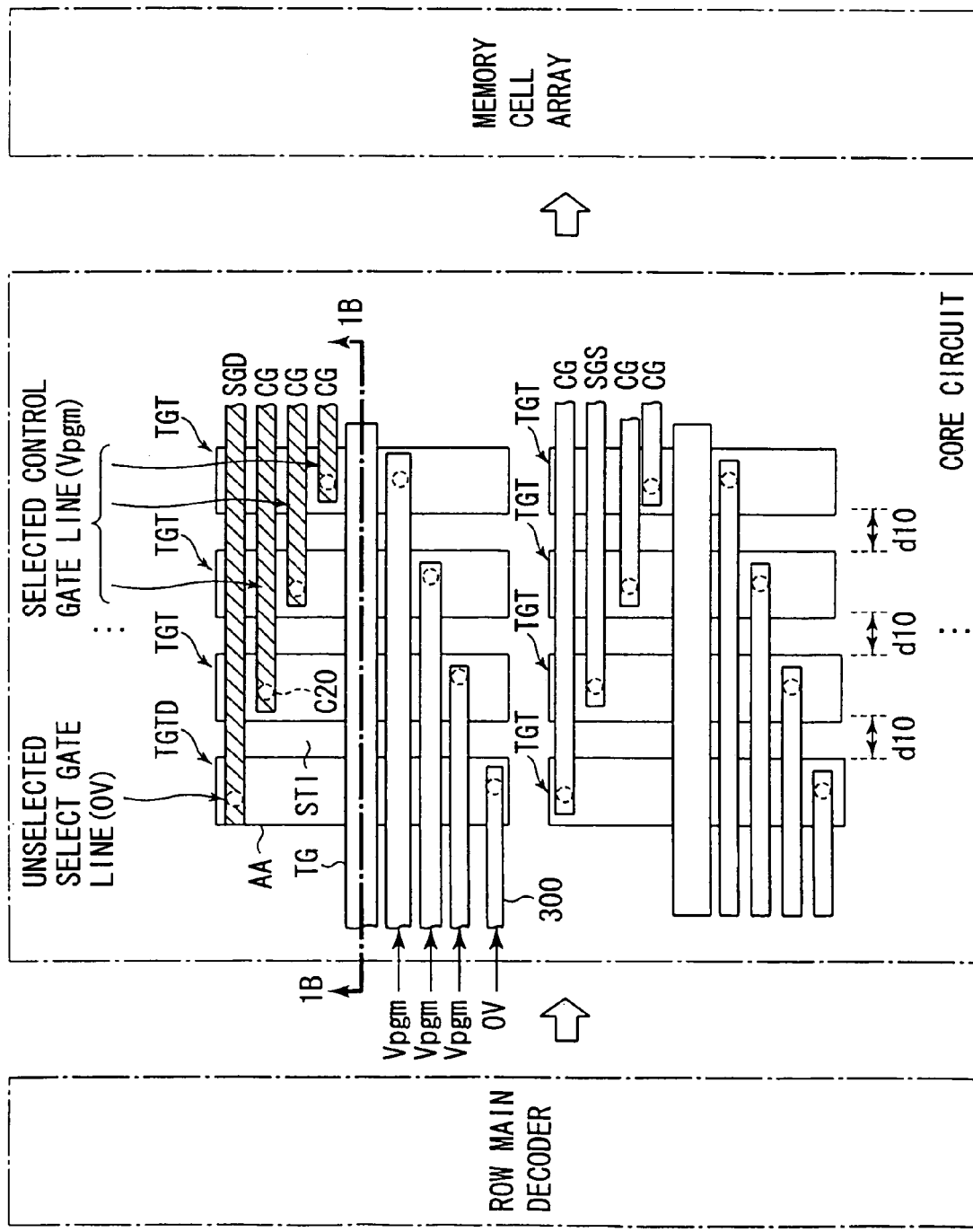
FIG. 1A is a plan view of a conventional NAND type flash memory.
Figure 1B:
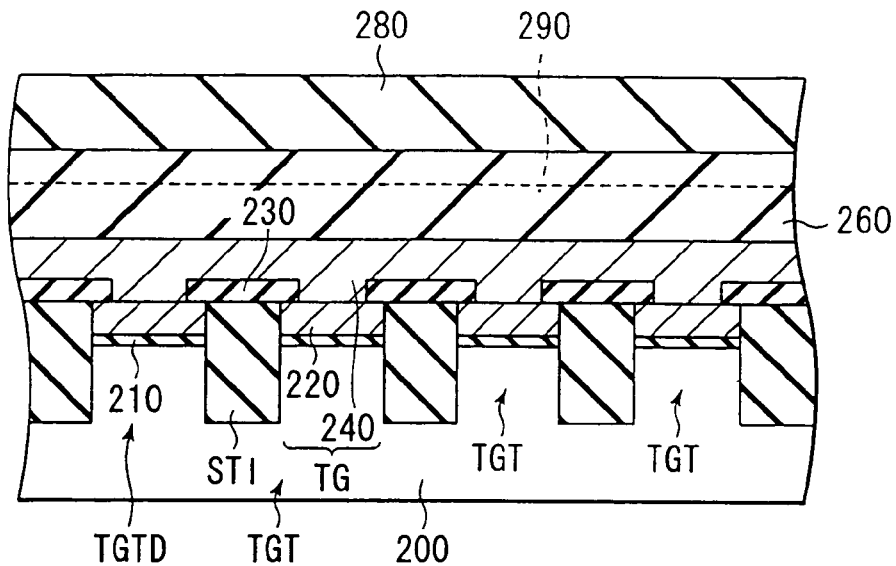
FIG. 1B is a cross-sectional view taken along line 1B—1B in FIG. 1A.
Figure 1C:
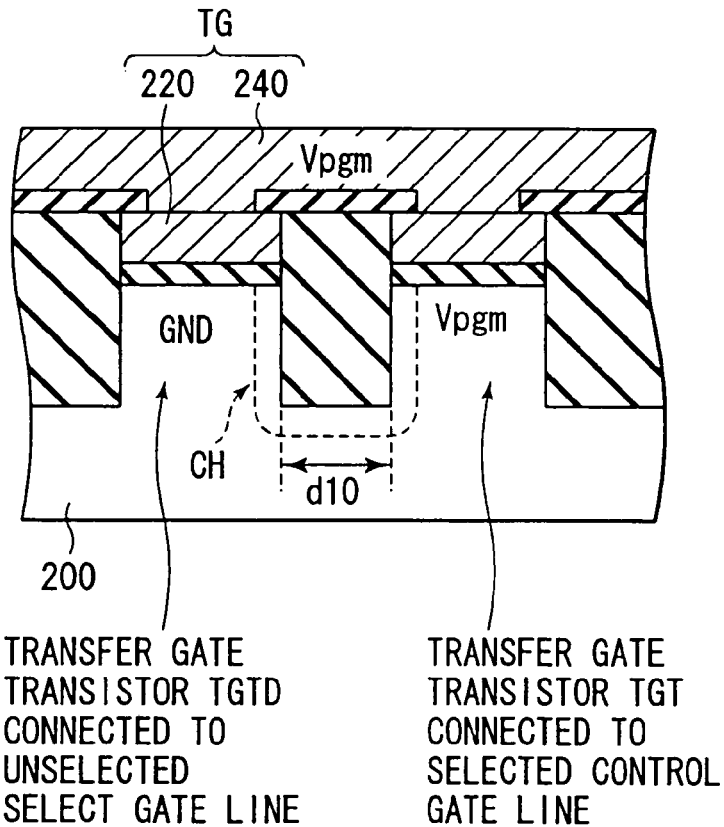
FIG. 1C is an enlarged view of FIG. 1B.

As shown in the Figures, in this embodiment, the gate electrodes TG of the transfer gate transistors arranged in the same row in the prior art (see FIGS. 1A and 1B) are separated for the respective transfer gate transistors. The gate electrodes TG of the transfer gate transistors in the same row are electrically commonly connected by a metal wiring layer TGMETAL provided at higher level than the gate electrodes TG.

Specifically, as shown in FIGS. 22A to 22C, a polysilicon layer 74, which becomes a part of the gate electrode TG of the transfer gate transistor, is partly removed down to the inter-gate insulating film 73 on the element isolation region STI that isolates the active areas AA. As a result, the gate electrode TG is formed of the polysilicon layers 72 and 74 that are separated for each transfer gate transistor. A metallic wiring layer 82 is provided in an interlayer insulating film 76 at a level equal to the level of the select gate lines SGD and SGS and shunt wiring 79 that serves as the control gate line CG. The metallic wiring layer 82 is connected to the gate electrodes TG of the transfer gate transistors arranged in the same row by means of plugs 81. In other words, the metal wiring layer serves as the wiring TGMETAL for commonly connecting the gate electrodes TG of the transfer gate transistors arranged in the same row.

According to the above structure, at least a part of the gate electrode TG on the element isolation region STI that isolates the active areas AA is removed. Thus, even if the high voltage Vpp is applied to the gate electrode TG, it is not applied to the element isolation region STI. Thus, an inversion region is prevented from forming in the silicon substrate 70 near the element isolation region STI. Accordingly, element isolation can be maintained without increasing the width of the element isolation region.

Figure 23A:
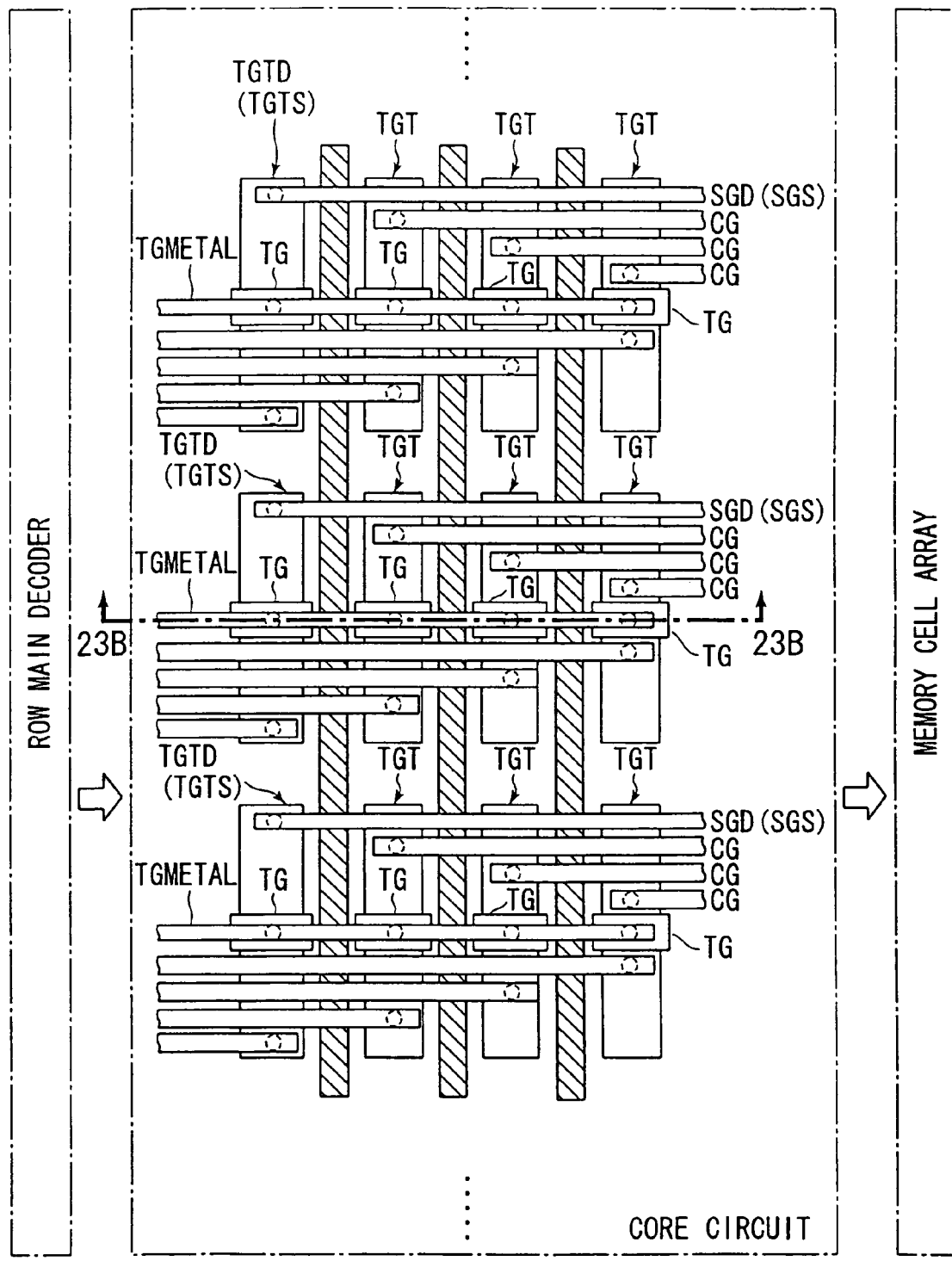
FIG. 23A is a plan view of a row core circuit of a NAND type flash memory according to a fifth embodiment of the invention.
Figure 23B:
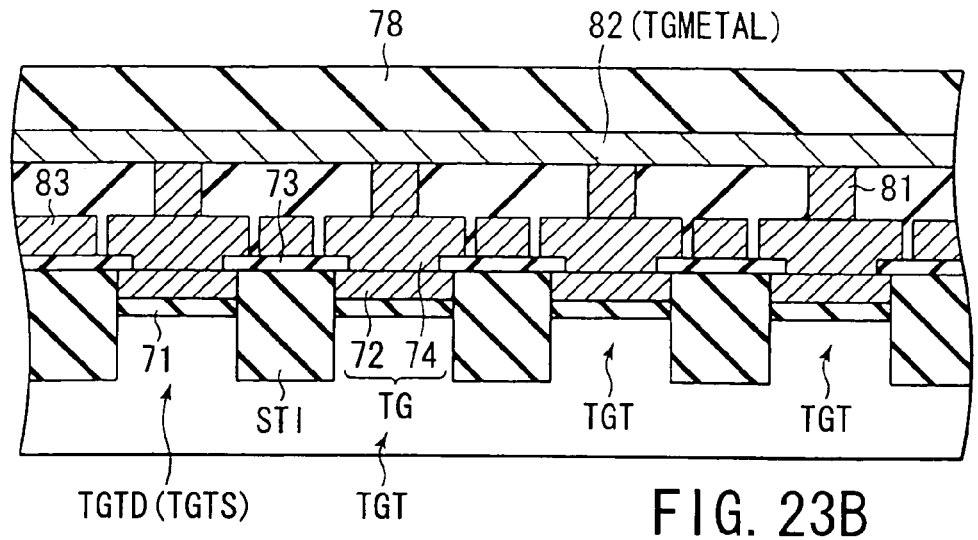
FIG. 23B is a cross-sectional view taken along line 23B—23B in FIG. 23A.

A semiconductor device according to a fifth embodiment of the invention will now be described, taking a NAND type flash EEPROM as an example. FIG. 23A is a plan view of a row core circuit, and FIG. 23B is a cross-sectional view taken along line 23B—23B in FIG. 23A.

As is shown in the Figures, in a row core circuit 68 of the NAND type flash EEPROM according to the fifth embodiment, a dummy gate electrode 83 is additionally provided between the adjacent transfer gate transistors arranged along the control gate line CG in the structure of the fourth embodiment. Specifically, a polysilicon film 83 is formed along the bit line BL on the element isolation region STI that isolates the active areas AA. The polysilicon film 83 is provided so as to pass between the adjacent gate electrodes TG arranged along the control gate line CG. The polysilicon film 83 is electrically isolated from the gate electrode TG by an interlayer insulating film 76. The polysilicon film 83 is supplied with 0V or −Vcc, irrespective of the operation state of the transfer gate transistor.

According to the above structure, the dummy gate electrode 83 is supplied with 0V or a negative potential. Thus, a parasitic MOS transistor comprising the dummy gate electrode 83, element isolation region STI and silicon substrate 70 is always turned off. Therefore, an inversion region is effectively prevented from forming in the silicon substrate near the element isolation region STI. As a result, element isolation can be maintained without increasing the width of the element isolation region. In the meantime, the dummy gate electrode 83 is supplied with 0V or −Vcc when the parasitic MOS transistor is of an n-channel type. When the parasitic MOS transistor is of a p-channel type, the dummy gate electrode may be supplied with, e.g. +Vcc.

Figure 24:
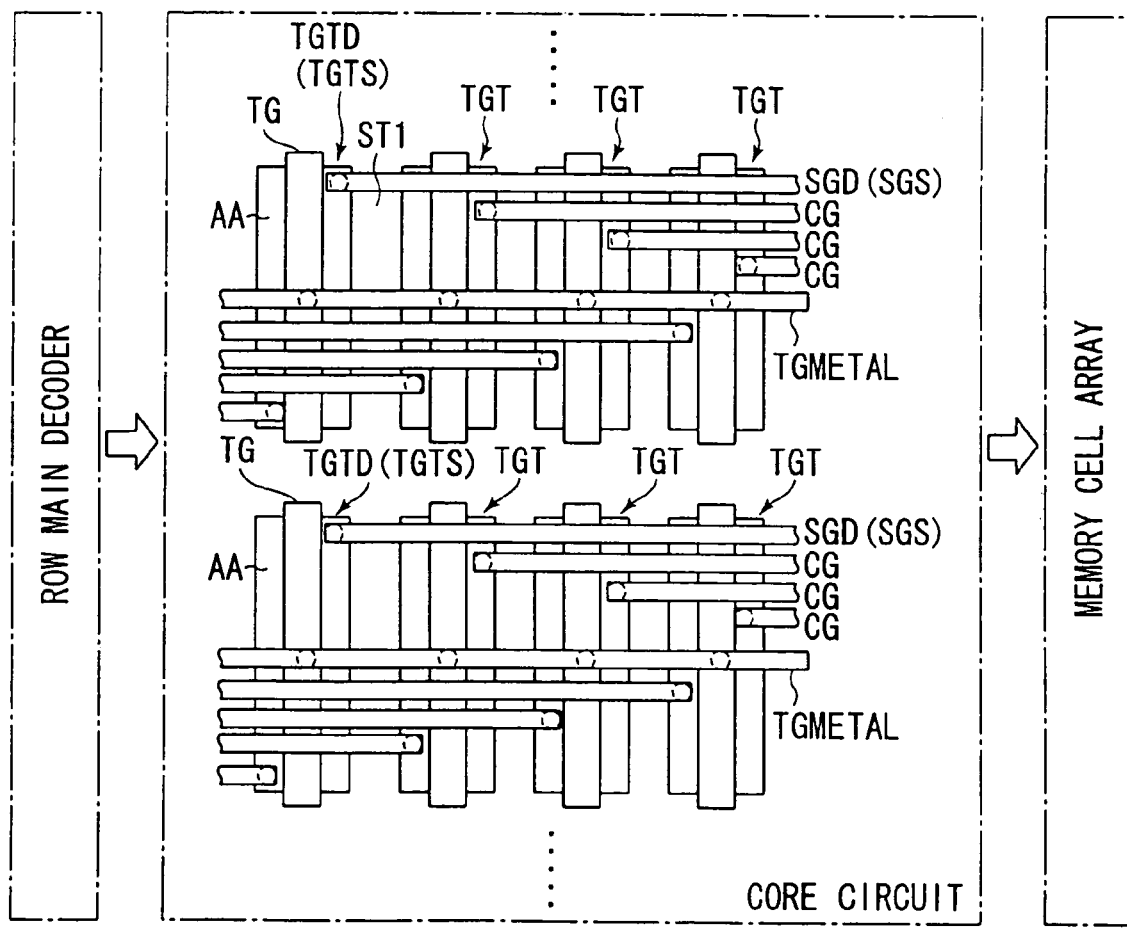
FIG. 24 is a plan view of a row core circuit of a NAND type flash memory according to a sixth embodiment of the invention.

A non-volatile semiconductor memory according to a sixth embodiment of the invention will now be described, taking a NAND type flash EEPROM as an example. FIG. 24 is a plan view of a row core circuit.

As is shown in FIG. 24, in the row core circuit of the NAND type flash EEPROM of the sixth embodiment, the transfer gate transistors TGTD, TGTS, TGT, . . . , in the structure of the fourth embodiment as shown in FIG. 22A, is rotated over 90°. Specifically, in each active area AA, the gate electrode TG is formed in a direction (bit line direction) perpendicular to the control gate line CG.

With this structure, too, the same advantages as with the fourth embodiment can be obtained. Needless to say, in the sixth embodiment, like the fifth embodiment, a dummy gate electrode may be provided between the adjacent active areas AA arranged along the control gate line.

Figure 25:
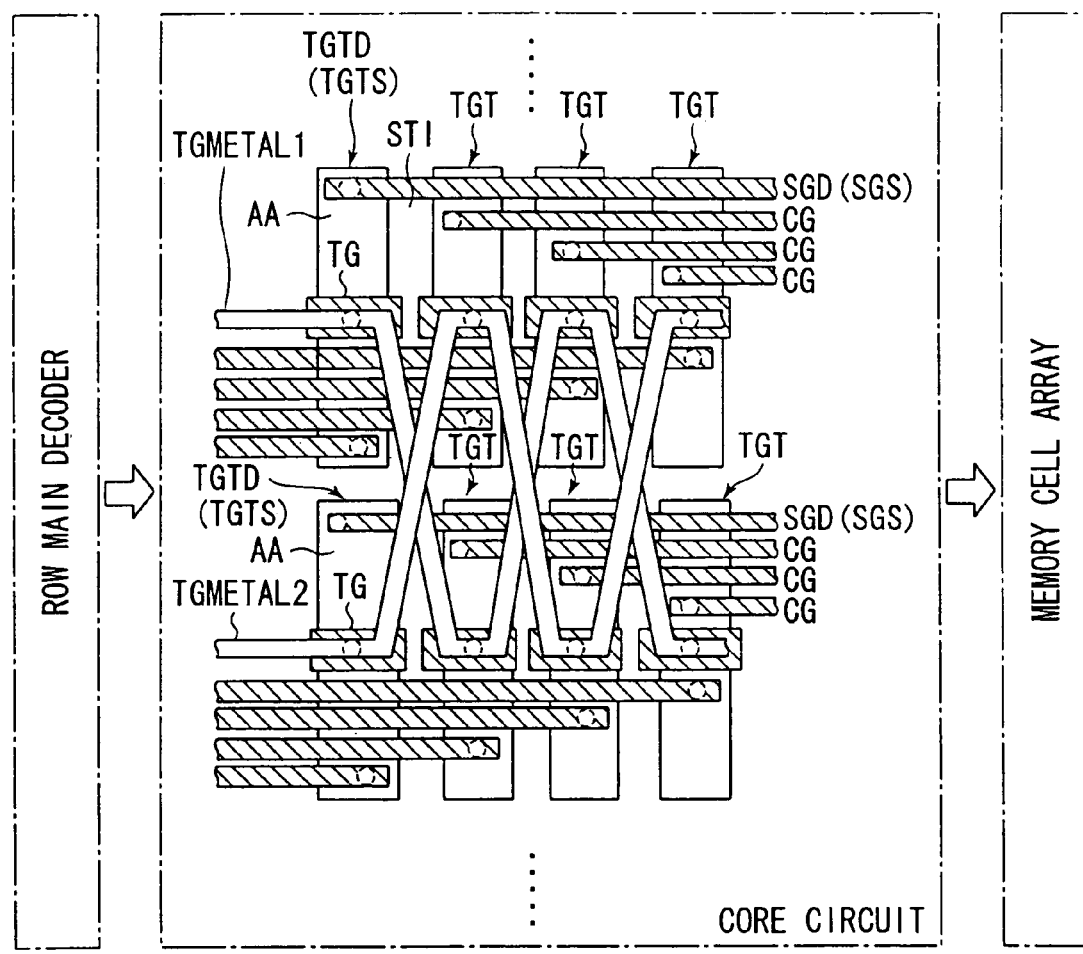
FIG. 25 and FIG. 26 are plan views of a row core circuit of a NAND type flash memory according to a seventh embodiment of the invention.

A non-volatile semiconductor memory according to a seventh embodiment of the invention will now be described, taking a NAND type flash EEPROM as an example. FIG. 25 is a plan view of a row core circuit.

As is shown in FIG. 25, in the row core circuit of the NAND type flash EEPROM of the seventh embodiment, the structure of the fourth embodiment as shown in FIG. 22A is changed such that the wiring elements for leading the select gate line and control gate lines out to the row core circuit are formed on the same level as the word lines of the memory cells. In addition, the gate electrodes TG of the transfer gate transistors are commonly connected using two metal wiring layers TGMETAL1 (M0) and TGMETAL2 (M1) provided on a level higher than those wiring elements. For example, the metal wiring layer TGMETAL1 is provided in the interlayer insulating film 76, and the metal wiring layer TGMETAL2 in the interlayer insulating film 78.

Unlike the third to sixth embodiments, the metal wiring layers TGMETAL1 and TGMETAL2 of this embodiment are commonly connected to the gate electrodes TG of transfer gate transistors arranged in different rows. For example, as shown in FIG. 25, two metal wiring layers TGMETAL1 and TGMETAL2 are alternately connected to the gate electrodes of the transfer gate transistors provided in two rows.

If the plural metal wiring layers for commonly connecting the gate electrodes TG of the transfer gate transistors are arranged to extend over different rows, as described above, the following advantages can be obtained in addition to the advantages of the fourth embodiment: mutual effects between the transfer gate transistors are suppressed, and the operational reliability of the transfer gate transistors can be enhanced.

Figure 26:
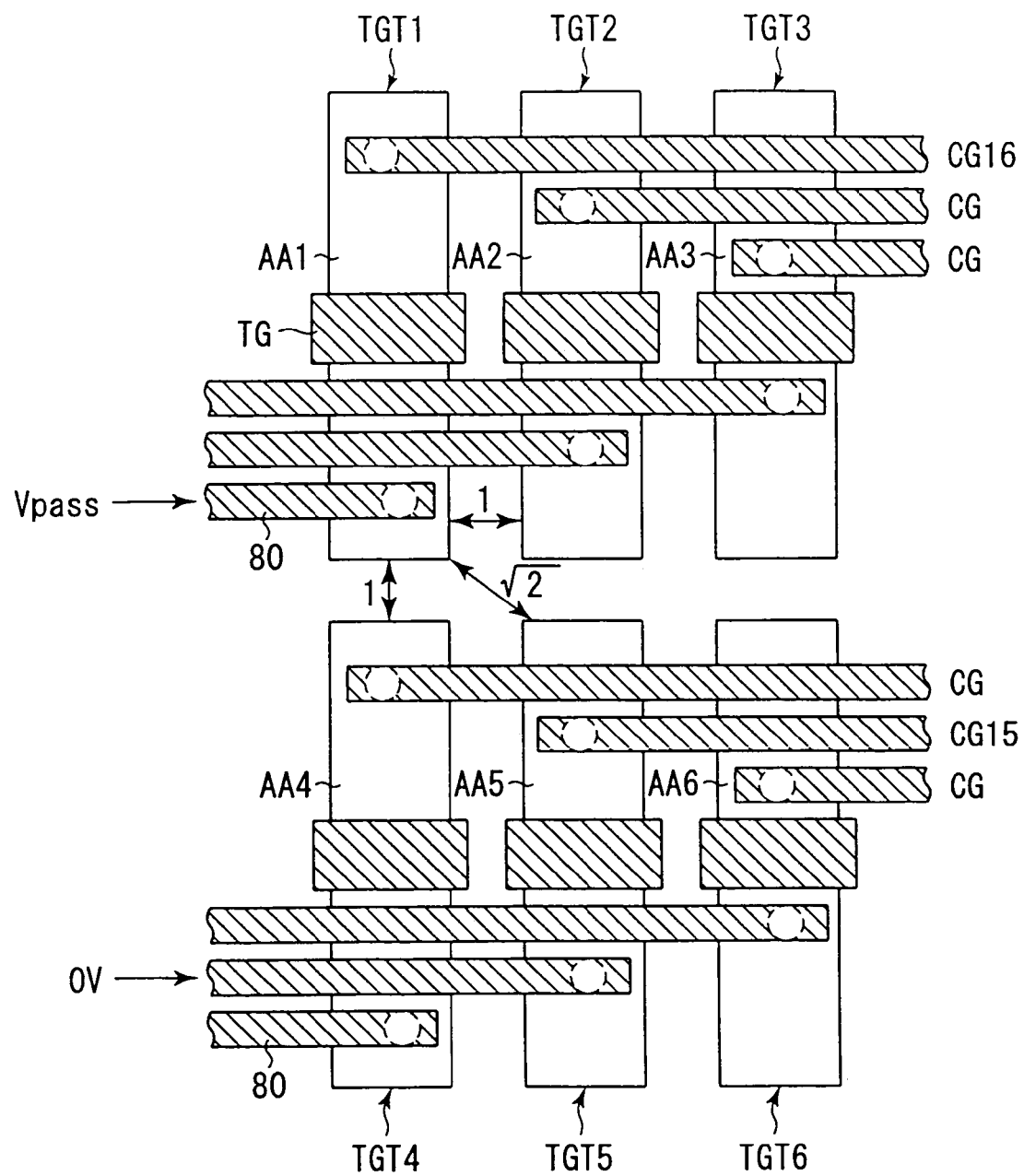

FIG. 26 is an enlarged view of FIG. 25. FIG. 26 omits showing of metal wiring layers TGMETAL1 and TGMETAL2 that connect the gate electrodes TG. Assume, however, that in FIG. 26 the gate electrodes of transfer gate transistors TGT1, TGT3 and TGT5 are commonly connected and the gate electrodes of transfer gate transistors TGT2, TGT4 and TGT6 are commonly connected. In addition, assume that a voltage Vpass is applied to the active area AA1 where the transfer gate transistor TGT1 is provided, and a voltage of 0V is applied to the active area AA5 where the transfer gate transistor TGT5 is provided.

According to this embodiment, the active areas AA1 and AA5 are adjacent to each other in an oblique direction, that is, neither in the direction parallel to the control gate lines CG nor in the direction perpendicular to the control gate lines CG. Specifically, if the distance between horizontally or vertically adjacent active areas is 1, the distance between obliquely adjacent active areas is $\sqrt{2}$. For example, in the above-described LSB method or ESB method, the active area supplied with Vpass and the active area supplied with 0V are disposed adjacent to each other in the oblique direction. Therefore, the distance between the adjacent active areas can be increased up to $\sqrt{2}$ of the distance in the ordinary case, and the insulation between active areas can be improved.

In this embodiment, too, the dummy gate electrode described in connection with the fifth embodiment can be provided, if the lead-out lines of select gate line SGD (SGS) and control gate lines CG and the metal wiring layers TGMETAL1 and TGMETAL2 are formed in the interlayer insulating films of the successively higher levels. In this case, the insulation performance of the element isolation region STI can further be enhanced.

As has been described above, according to the third to seventh embodiments, in the row core circuit of the NAND type flash EEPROM, the transfer gate transistors connected to the select gate line SGD, SGS, are arranged in the column at the end portion of the row core circuit. Thus, the transfer gate transistor connected to the select gate line and the transfer gate transistor connected to the control gate line are positioned adjacent to each other only in the area between the active area in this column and the adjacent active area. In short, a high withstand voltage is required only in the element isolation region in this area. The withstand voltage in this context means a withstand voltage against formation of a channel region due to a parasitic MOS transistor in the vicinity of the element isolation region. Accordingly, element isolation between columns of active areas can sufficiently be effected by increasing the width of only the element isolation region STI in this area, and keeping the ordinary width of element isolation regions on the other area. Therefore, the insulation performance of the element isolation region can be enhanced while the increase in area of the row core circuit is limited to a minimum.

The gate electrodes of transfer gate transistors are separated for the respective transfer gate transistors. Thus, a high voltage, which turns on the transfer gate transistors, is not applied to the element isolation region between the columns of the transfer gate transistors that are arranged adjacent to each other in the same row. Therefore, the withstand voltage of the element isolation region can be enhanced without increasing the area of the row core circuit. The dummy gate electrodes are formed on the element isolation regions arranged adjacent to each other in the same row. The potential of the dummy gate electrode is set at a level that can turn off the parasitic MOS transistor. Therefore, the withstand voltage of the element isolation region can further be enhanced.

In the third embodiment, the transfer gate transistor connected to the select gate line is located, by way of example, at the area closest to the row main decoder. However, needless to say, this transfer gate transistor may be located at the area closest to the memory cell array. In the third embodiment, it should suffice if all the transfer gate transistors connected to the select gate lines are arranged in the same column at the end portion of the row core circuit. Thus, any one of the transfer gate transistors connected to the control gate lines may possibly be positioned in the same column as the transfer gate transistor connected to the select gate line.

In the fourth to seventh embodiments, too, the transfer gate transistor connected to the select gate line is located, by way of example, at the area closest to the row main decoder. However, in the fourth to seventh embodiments, the withstand voltage of the element isolation region is enhanced by removing the gate electrode TG on the element isolation region. Therefore, there is no need to arrange the transfer gate transistors connected to the select gate lines in the same column at the end portion of the row core circuit. The transfer gate transistors connected to the select gate lines may be arranged at random within the row core circuit.

In the seventh embodiment, the metal wiring layer TGMETAL is formed to extend over the active areas of the two rows. Alternatively, it may be formed to extend over active areas of three or more rows.

In the third to seventh embodiments, the NAND type flash EEPROMs have been described by way of example. However, this embodiment is generally applicable to semiconductor memory devices that face the problem of insulation between adjacent active areas.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for fabricating a semiconductor device, comprising:
    implanting impurities of a first conductivity in a surface of a semiconductor substrate at a first concentration;
    forming a gate insulating film on the surface of the semiconductor substrate;
    forming a charge storage layer on the gate insulating film;
    forming a element isolation region in the semiconductor substrate and the gate insulating film;
    forming an inter-gate insulating film on the element isolation region and the charge storage layer;
    forming on the inter-gate insulating film a mask material having an opening portion which exposes at least a part of a surface of the inter-gate insulating film;
    implanting impurities of the first conductivity type in the semiconductor substrate via the opening portion in the mask material at a second concentration higher than the first concentration;
    removing the inter-gate insulating film that is exposed to the opening portion in the mask material;
    forming a control gate electrode on the inter-gate insulating film, the control gate electrode being connected to the charge storage layer via a region where the inter-gate insulating film has been removed;
    forming a stacked gate electrode by patterning the charge storage layer, the inter-gate insulating film and the control gate electrode; and
    forming source and drain regions by implanting impurities of a second conductivity type in the semiconductor substrate around the gate electrode.

2. The method according to claim 1, wherein the forming of the mask material on the inter-gate insulating film includes:
    forming the mask material on the inter-gate insulating film; and
    forming the opening portion in the mask material.

3. A method for fabricating a semiconductor device, comprising:
    implanting impurities of a first conductivity in a surface of a semiconductor substrate at a first concentration;
    forming a gate insulating film on the surface of the semiconductor substrate;
    forming a charge storage layer on the gate insulating film;
    forming a element isolation region in the semiconductor substrate and the gate insulating film;
    forming an inter-gate insulating film on the element isolation region and the charge storage layer;
    forming a mask material on the inter-gate insulating film at regions where first and second transistors are to be formed, the mask material having an opening portion which exposes at least a part of a surface of the inter-gate insulating film at the region where the first transistor is to be formed;
    implanting impurities of the first conductivity type in the semiconductor substrate via the opening portion in the mask material at a second concentration higher than the first concentration;
    removing the inter-gate insulating film that is exposed to the opening portion in the mask material;
    forming a control gate electrode on the inter-gate insulating film, the control gate electrode at the region where the first transistor is to be formed being connected to the charge storage layer via a region where the inter-gate insulating film has been removed;
    forming stacked gate electrodes of the first and second transistors by patterning the charge storage layer, the inter-gate insulating film and the control gate electrode; and
    forming source and drain regions of the first and second transistors by implanting impurities of a second conductivity type in the semiconductor substrate around the gate electrode.

4. The method according to claim 3, wherein the forming of the mask material on the inter-gate insulating film includes:
    forming the mask material on the inter-gate insulating film; and
    forming the opening portion in the mask material.

* * * * *